United States Patent [19]

Mochizuki et al.

[11] Patent Number: 5,200,663
[45] Date of Patent: Apr. 6, 1993

[54] SURFACE ACOUSTIC WAVE DEVICE PROVIDED WITH OUTPUT TRANSDUCER SPLIT INTO A PLURALITY OF PORTIONS, AND COMMUNICATION SYSTEM USING THE SAME

[75] Inventors: Norihiro Mochizuki, Atsugi; Koichi Egara, Tokyo; Kenji Nakamura, Hadano, all of Japan

[73] Assignee: Canon Kabushiki Kaisha, Tokyo, Japan

[21] Appl. No.: 750,392

[22] Filed: Aug. 27, 1991

[30] Foreign Application Priority Data

| Aug. 29, 1990 | [JP] | Japan | 2-225086 |
| Aug. 29, 1990 | [JP] | Japan | 2-225087 |
| Aug. 29, 1990 | [JP] | Japan | 2-225088 |
| Aug. 29, 1990 | [JP] | Japan | 2-225089 |
| Aug. 29, 1990 | [JP] | Japan | 2-225090 |

[51] Int. Cl.$^5$ .................................... H01L 41/08
[52] U.S. Cl. .................. 310/313 D; 333/154; 364/821
[58] Field of Search ........... 310/313 R, 313 B, 313 D; 333/153, 154, 195; 364/821

[56] References Cited

U.S. PATENT DOCUMENTS

| 3,833,867 | 9/1974 | Solie | 333/30 |
| 4,798,987 | 1/1989 | Nakamura | 310/313 |
| 5,003,213 | 3/1991 | Mochuzuki et al. | 310/313 D |

OTHER PUBLICATIONS

"Surface Acoustic Wave Convolver Using Multiple Waveguide" by Yosuhiko Nakagawa et al., Electronic Communication Society Journal vol. J69-C, No. s pp. 190-198 (1986).

"A New Interdigital Electrode Transducer Geometry" by K. Lakin et al. IEEE Transactions on Microwave Tehory and Techniques, Aug. 1974 vol. MTT-22, No. 8 pp. 763-768.

"Surface Acoustic Wave Convolver Using Multi--Channel Waveguide" Nakagawa et al. Japanese Journal Of Applied Physics, vol. 28, No. Sup2, 1989, Kyoto pp. 221-223.

"Surface Acoustic Wave Engineering" by H. Shibayama, Soc. of Electronic Communication., pp. 82-102, 1983.

*Primary Examiner*—Mark O. Budd
*Attorney, Agent, or Firm*—Fitzpatrick, Cella, Harper & Scinto

[57] ABSTRACT

A surface acoustic wave device comprises a piezoelectric substrate, a plurality of input transducers, formed on the substrate, for generating surface acoustic waves corresponding to input signals, a plurality of waveguides which are juxtaposed on a region of said substrate where the surface acoustic waves generated by said input transducers overlap each other, and in which signals are generated due to an interaction of the surface acoustic waves, the waveguides generating surface acoustic waves corresponding to the signals due to the interaction, and an output transducer for receiving the surface acoustic waves generated from the waveguides, converting the signals due to the interaction into electrical signals, and extracting the electrical signals, the output transducer being constituted by a plurality of portions, juxtaposed in a widthwise direction of the surface acoustic waves generated from the waveguides, for receiving some components of the surface acoustic waves generated from the waveguides, and outputting signals, the portions being connected to each other, so that electric fields of electrical signals output from said portions are synthesized in the same direction.

42 Claims, 21 Drawing Sheets

F I G. 16
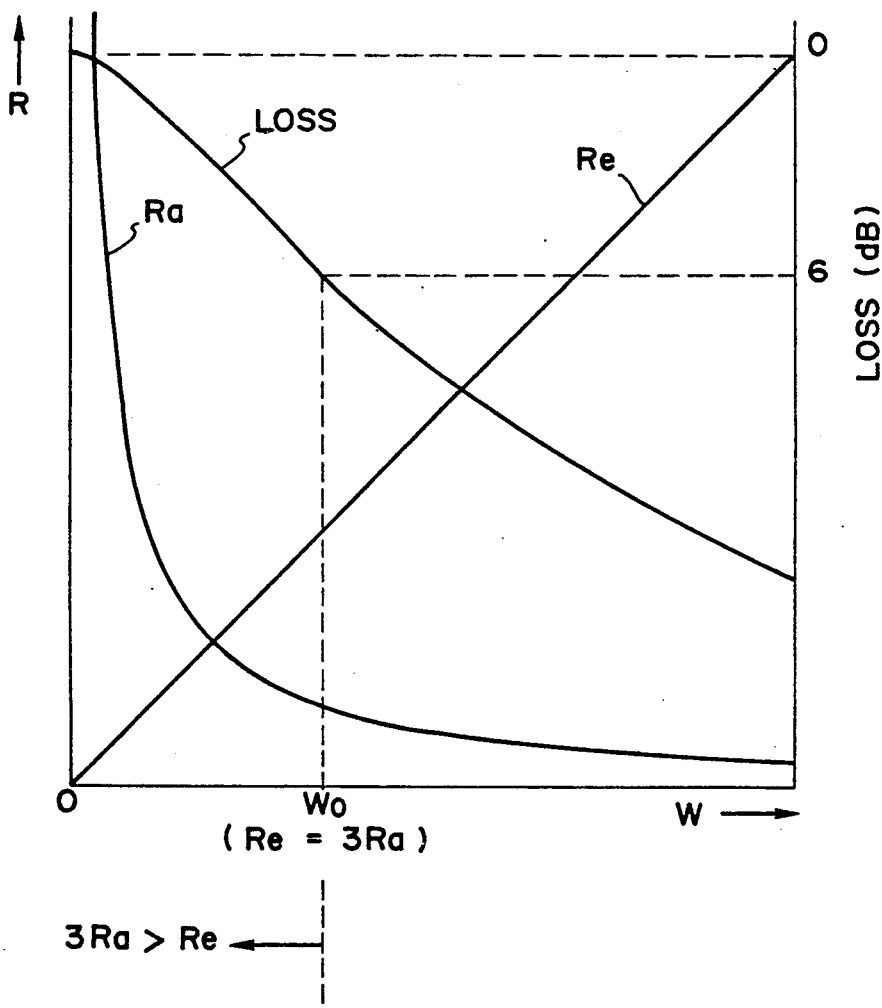

F I G. 17
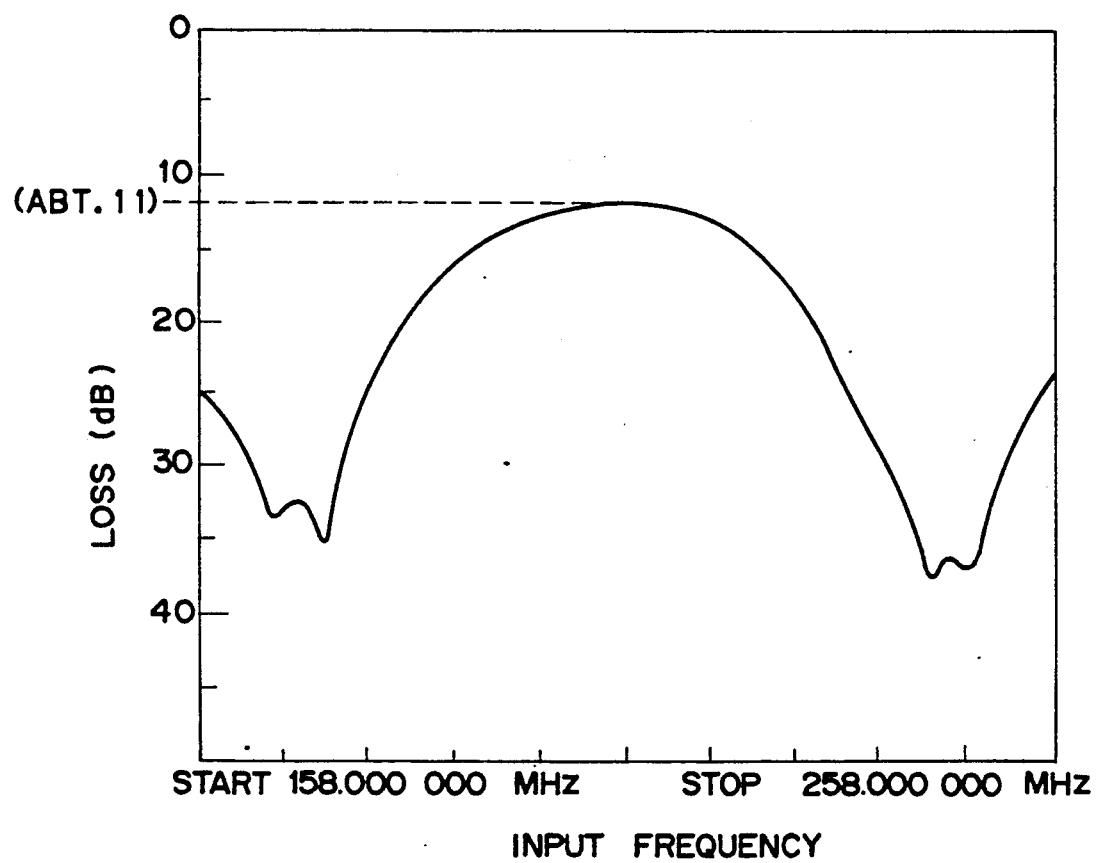

SURFACE ACOUSTIC WAVE DEVICE PROVIDED WITH OUTPUT TRANSDUCER SPLIT INTO A PLURALITY OF PORTIONS, AND COMMUNICATION SYSTEM USING THE SAME

BACKGROUND OF THE INVENTION

Field of the Invention

The present invention relates to a surface acoustic wave element for transmitting or propagating a plurality of surface acoustic waves on a piezoelectric substrate, and extracting a signal generated by an interaction of these surface acoustic waves by utilizing a physical nonlinear effect of the substrate, and a communication system using the same.

Related Background Art

In recent years, a surface acoustic wave element has been gaining its importance as a key device upon execution of a spread spectrum communication. In addition, many applications as a real-time signal processing device have been proposed, and extensive studies about it have been made.

FIG. 1 is a schematic plan view showing an example of a conventional surface acoustic wave element.

In FIG. 1, a pair of input interdigital transducers 2 are arranged on a piezoelectric substrate 1, and a center electrode 3 is arranged between these transducers. The transducers 2 serve as electrodes for exciting surface acoustic wave signals, and the center electrode 3 serves as an electrode for propagating the surface acoustic wave signals in opposite directions, and extracting an output signal.

When a signal $F(t)\exp(j\omega t)$ is applied to one of the transducers 2, and a signal $G(t)\exp(j\omega t)$ is applied to the other transducer, two surface acoustic waves in opposite directions given by the following formulas propagated on the surface of the piezoelectric substrate 1:

$$F(t-x/v)\exp[j\omega(t-x-x/v)] \qquad 1(a)$$

and $$G(t-(L-x)/v)\exp[j\omega(t-(L-x)/v)] \qquad 1(b)$$

where v is the surface acoustic wave velocity, and L is the length of the center electrode 3.

On this propagation path, a product component of the surface acoustic waves is generated by a nonlinear effect, and is integrated and extracted within the range of the center electrode 3. This output signal $H(t)$ is expressed by:

$$H(t) = \alpha \cdot \exp(j2\omega t) \int_0^L F(t - x/v)G(t - (L - x)/v)dx \qquad (2)$$

where $\alpha$ is the proportional constant.

In this manner, a convolution signal of the two signals $F(t)$ and $G(t)$ can be obtained from the center electrode 3.

However, since this arrangement cannot provide sufficient efficiency, "Nakagawa, et al., The Transactions of Institute of Electronics, Information Communication Engineers, '86/2, Vol. j69-C, No. 2, pp. 190–198" proposes a surface acoustic wave element shown in FIG. 2. Note that the coordinate axes shown in FIG. 2 are added for the sake of easy understanding, and do not mean crystallographic axes of a substrate.

In FIG. 2, two opposing surface acoustic wave excitation input interdigital transducers 12 and 13 are formed on the surface of a piezoelectric substrate 11 to be separated by a proper distance in the x direction. Parallel waveguides 14-1, 14-2, ..., 14-n are formed on the surface of the substrate 11 to extend in the x direction between the transducers 12 and 13. An output interdigital transducer 15 is formed on the surface of the substrate 11 to be separated from the waveguides by a proper distance in the y direction.

In this surface acoustic wave device, when electrical signals having an angular frequency $\omega$ are input to the surface acoustic wave excitation transducers 12 and 13, surface acoustic waves having the above frequency are excited, and propagate along the waveguides 14-1, 14-2, ..., 14-n in the opposite directions in the x direction, and a surface acoustic wave having an angular frequency $2\omega$ propagating in the y direction is generated from the waveguides due to a parametric mixing phenomenon. This surface acoustic wave reaches the output transducer 15, and a convolution electrical signal of the two input signals can be obtained by the output transducer 15.

However, in the surface acoustic wave element device in FIG. 2, when the interaction length (integration time) of the signals is to be increased, the length of each of the waveguides 14-1 to 14-n must be increased. Since the length of the output transducer is equal to the length of each waveguide, the length of the output transducer is inevitably increased as the interaction length is increased.

Since the width of each electrode finger of the output transducer is determined by the frequency of the convolution signal, and the propagation speed of the surface acoustic wave on the substrate, the width is decreased as the input center frequency is increased, and the resistance is undesirably increased.

For example, when an output transducer comprising an interdigital electrode having six pairs of electrode fingers (an intersection width=20 mm, a line width=4.4 μm, and a film thickness=0.3 μm), and formed of aluminum is formed on a lithium niobate substrate, a radiation resistance is about 2.4Ω, while each electrode finger has an electrode finger resistance of about 410Ω, and the resistance of the overall interdigital electrode is about 68Ω.

When a conversion loss in the output transducer with this structure was measured, a very large loss of about 22 dB was observed, as shown in FIG. 3.

In this manner, when the surface acoustic wave waveguide is prolonged, and the intersection width of the interdigital electrode is increased in order to simultaneously process a large number of signals, the resistances of the electrode fingers constituting the interdigital electrode are increased, and a loss caused by the electrode resistances of the interdigital electrode is increased. As a result, efficiency of the device as a whole is decreased, thus impairing characteristics of the device.

On the other hand, "Nakagawa, et al., Jpn. J. Appl. Phys., Vol. 28, supplement 28-2, pp. 221-223 (1989)" proposes a surface acoustic wave device, as shown in FIG. 4. The same reference numerals in FIG. 4 denote the same parts as in FIG. 2, and a detailed description thereof will be omitted.

In the device shown in FIG. 4, an output transducer is constituted by a plurality of portions 25-1, 25-2, and 25-3 each comprising an interdigital electrode so as to prevent interference due to an electrical delay. Each of these portions 25-1 to 25-3 receives ⅓ components of surface acoustic waves generated from waveguides 14-1 to 14-n, and converts these components into an electrical signal. Output signals from these portions 25-1 to 25-3 are electrically synthesized, and the synthesized signal is extracted from output terminals 9a and 9b via an output line 26.

However, in the structure shown in FIG. 4, electric fields of signals output from the portions 25-1, 25-2, and 25-3 of the output transducer are opposite to each other, as indicated by arrows E1', E2', and E3'. For this reason, the outputs from the portions 25-1 and 25-3, and the output from the portion 25-2 cancel each other, and a convolution signal cannot be efficiently extracted from the terminals 9a and 9b.

SUMMARY OF THE INVENTION

It is an object of the present invention to provide a surface acoustic wave element which can solve the problems of the conventional techniques, and can efficiently extract a signal by reducing an electrical resistance, and a communication system using the same.

In order to achieve the above object of the present invention, there is provided a surface acoustic wave device comprising:

a piezoelectric substrate;

a plurality of input transducers, formed on the substrate, for generating surface acoustic waves corresponding to input signals;

a plurality of waveguides which are juxtaposed on a region of the substrate where the surface acoustic waves generated by the input transducers overlap each other, and in which signals are generated due to an interaction of the surface acoustic waves, the waveguides generating surface acoustic waves corresponding to the signals due to the interaction; and an output transducer for receiving the surface acoustic waves generated from the waveguides, converting the surface acoustic waves into electrical signals, and extracting the electrical signals, the output transducer being constituted by a plurality of portions, juxtaposed in a widthwise direction of the surface acoustic waves generated from the waveguides, for receiving some components of the surface acoustic waves generated from the waveguides, and outputting signals, the portions being connected to each other, so that electric fields of electrical signals output from the portions are synthesized in the same direction.

According to an aspect of the present invention, there is provided a communication system comprising:

(a) a transmitter for transmitting a signal modulated according to information;

(b) a reception circuit for receiving the modulated signal transmitted from the transmitter;

(c) a reference signal generating circuit for generating a reference signal;

(d) a surface acoustic wave device for outputting a convolution signal of the signal received by the reception circuit, and the reference signal; and (e) a demodulation circuit for demodulating the information using the convolution signal output from the surface acoustic wave device.

the surface acoustic wave device comprising:

a piezoelectric substrate;

a first input transducer, formed on the substrate, for generating a surface acoustic wave corresponding to a signal received by the reception circuit;

a second input transducer, formed on the substrate, for generating a surface acoustic wave corresponding to the reference signal;

a plurality of waveguides which are juxtaposed on a region of the substrate where the surface acoustic waves from the first and second input transduces overlap each other, and in which a convolution signal of the input signals is generated due to an interaction of the surface acoustic waves, the waveguides generating a surface acoustic wave corresponding to the convolution signal; and an output transducer for receiving the surface acoustic wave from the waveguides, converting the convolution signal into an electrical signal, and outputting the electrical signal, the output transducer comprising a plurality of portions, juxtaposed in a widthwise direction of the surface acoustic waves generated from the waveguides, for receiving some components of the surface acoustic wave generated from the waveguides, and outputting signals, the portions being connected, so that electric fields of electrical signals output from the portions are synthesized in the same direction.

BRIEF DESCRIPTION OF THE DRAWINGS

FIG. 16 is a graph showing the relationship among a maximum intersection width, a radiation resistance, and an electrode finger resistance of an interdigital electrode;

FIG. 17 is a graph showing a conversion loss of an output transducer in a surface acoustic wave device of the present invention;

DETAILED DESCRIPTION OF THE PREFERRED EMBODIMENTS

Figure 5:
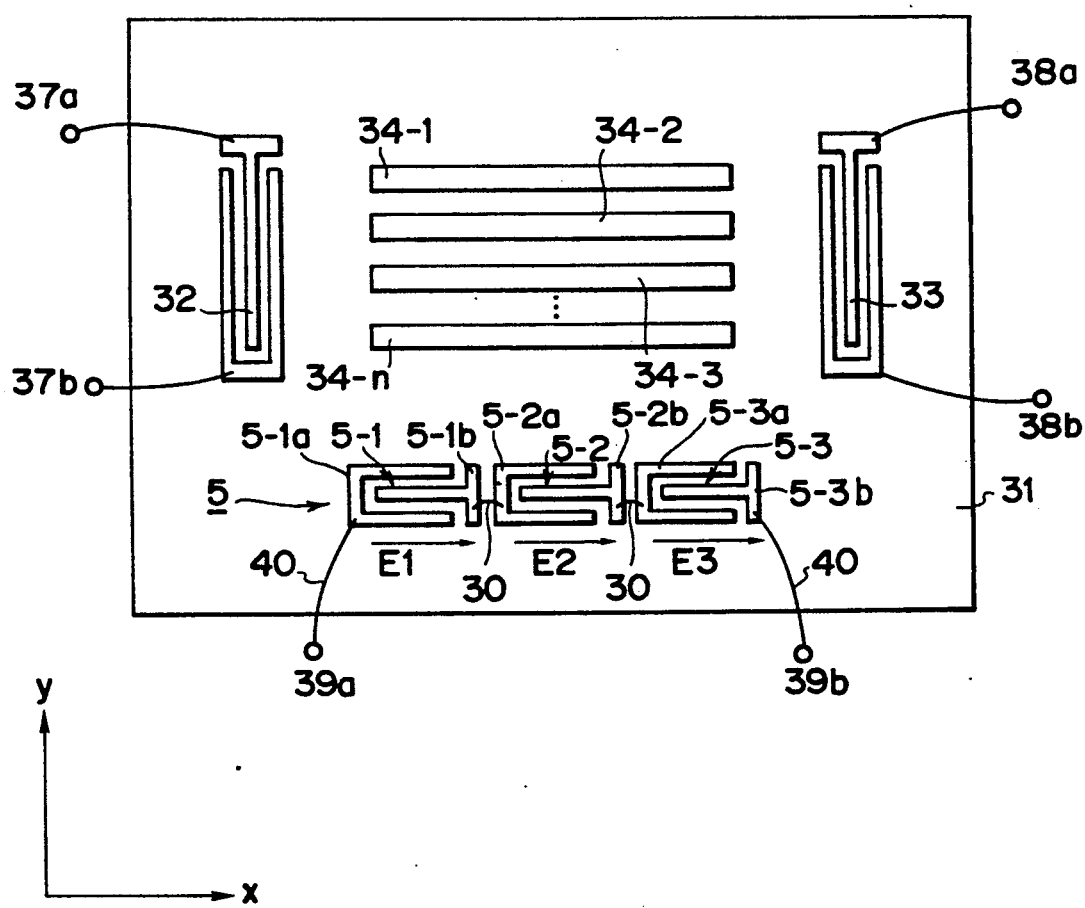
FIGS. 5 to 15 are schematic plan views showing the first to eleventh embodiments of a surface acoustic wave device according to the present invention.

FIG. 5 is a schematic plan view showing the first embodiment of a surface acoustic wave device according to the present invention.

In FIG. 5, a piezoelectric substrate 31 may adopt a substrate formed of, e.g., lithium niobate.

Opposing input interdigital transducers 32 and 33 are formed on the surface of the substrate 31 to be separated by a proper distance in the x direction. The transducers 32 and 33 comprise interdigital electrodes. The interdigital electrodes are prepared by a photolithography technique using a conductor such as aluminum, silver, gold, and the like as a material. These transducers 32 and 33 are arranged to excite surface acoustic waves propagating in the positive and negative directions of the x axis, respectively.

Surface acoustic wave waveguides 34-1, 34-2, 34-3, ..., 34-n are formed between the transducers 32 and 33 on the surface of the substrate 31. These waveguides extend in the x direction to be parallel to each other, and are arranged at a predetermined pitch.

The waveguides are described in detail in Hoshio Shibayama (Ed.), "Surface Acoustic Wave Enginerring", Society of Electronic Communications, pp. 82-102, and a thin-film waveguide, a topographic waveguide, and the like are known. In this invention, a $\Delta v/v$ waveguide formed by covering the surface of a substrate with a conductor such as aluminum, silver, gold, and the like is preferably used.

An output interdigital transducer 5 is formed on the surface of the substrate 31 to be separated from the waveguides 34-1 to 34-n by a proper distance in the y direction. The transducer 5 is constituted by a plurality of portions 5-1, 5-2, and 5-3 split in the x direction. These portions 5-1 to 5-3 comprise interdigital electrodes. The interdigital electrode is prepared by a photolithography technique using a conductor such as aluminum, silver, gold, and the like as a material.

Each of the portions 5-1 to 5-3 of the output transducer converts some components of surface acoustic waves generated from the waveguides 34-1 to 34-n into an electrical signal. These three portions can receive the total bandwidth of the surface acoustic waves.

The portion 5-1 of the output transducer is constituted by electrodes 5-1$a$ and 5-1$b$. Similarly, the portion 5-2 is constituted by electrodes 5-2$a$ and 5-2$b$, and the portion 5-3 is constituted by electrodes 5-3$a$ and 5-3$b$. The electrode fingers 5-1$b$ and 5-2$b$, and the electrodes fingers 5-2$b$ and 5-3$a$ are electrically connected to each other through wires (conductive wires) 30, respectively. Lead wires 40 are connected to the electrode fingers 5-1$a$ and 5-3$b$, so that an output signal can be extracted between output terminals 39$a$ and 39$b$.

In the surface acoustic wave device of this embodiment, when an electrical signal having a central angular frequency $\omega$ is input to one pair of input terminals 37$a$ and 37$b$, a first surface acoustic wave is excited by the input transducer 32. The first surface acoustic wave propagates in the positive direction of the x axis, and is incident on the waveguides 34-1 to 34-n. Similarly, when an electrical signal having a central angular frequency $\omega$ is input to the other pair of input terminals 38$a$ and 38$b$, a second surface acoustic wave is excited by the input transducer 33. The second surface acoustic wave propagates in the negative direction of the x axis, and is incident on the waveguides 34-1 to 34-n.

In this manner, the first and second surface acoustic waves propagate in opposite directions in each of the waveguides 34-1 to 34-n. The waveguides 34-1 to 34-n generate a third surface acoustic wave having a central angular frequency $2\omega$ and transmitted in the y direction due to the parametric mixing phenomenon. The third surface acoustic wave corresponds to a convolution signal of the signals input to the input transducers 32 and 33. The third elastic surface wave is split and received by the corresponding portions 5-1 to 5-3 of the output transducer, and is converted into electrical signals.

The electric fields of the electrical signals output from the portions 5-1, 5-2, and 5-3 of the output transducer are respectively represented by E1, E2, and E3, as shown in FIG. 5. Of the electrodes of these portions, since the electrodes 5-1$b$ and 5-2$b$, and the electrodes 5-2$b$ and 5-3$a$ having opposing polarities of the electrical signals are respectively connected in series with each other, the output signals of the respective portions are synthesized in the same direction (in phase with each other), and the synthesized signal is extracted from the output terminals 39$a$ and 39$b$.

Note that an arranging pitch (the center-to-center distance between adjacent waveguides) of the surface acoustic wave waveguides 34-1 to 34-n is formed to be equal to the wavelength of the third surface acoustic wave generated from these waveguides. With this structure, signal waves generated from the waveguides 34-1 to 34-n overlap to be in phase with each other, thus efficiently exciting the third surface acoustic wave.

Figure 6:
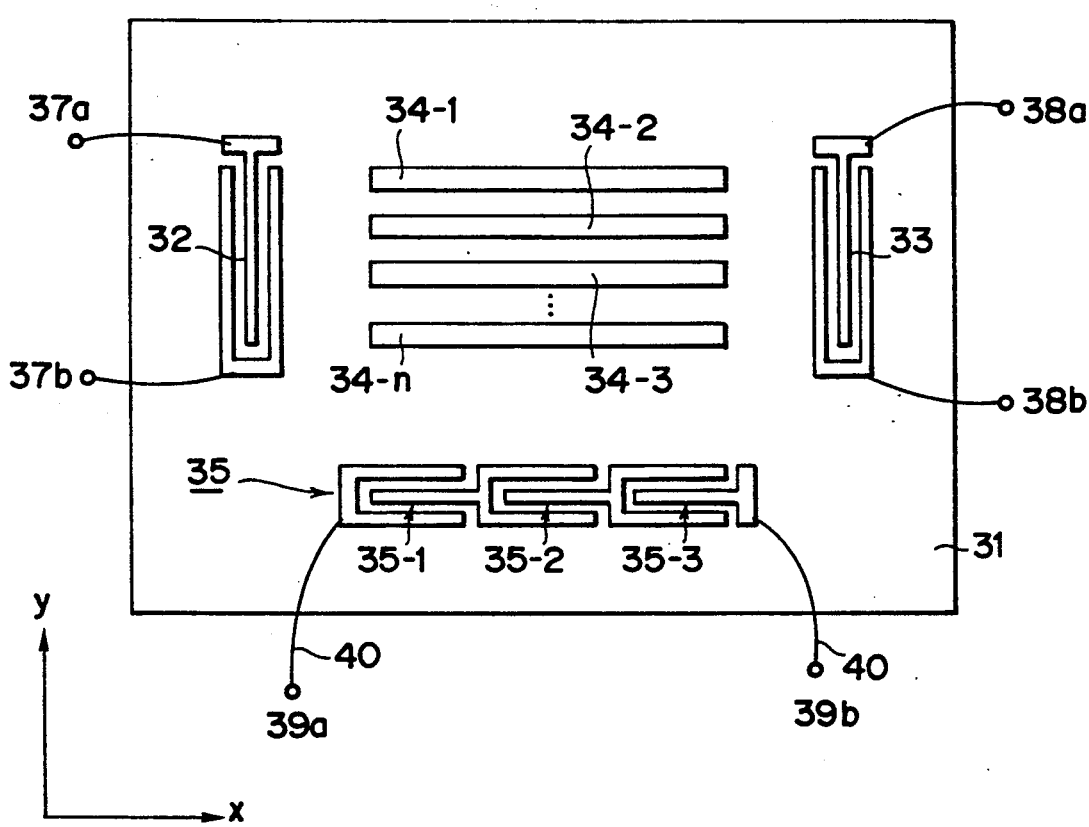

FIG. 6 is a schematic plan view showing the according to the present invention. The same device numerals in FIG. 6 denote the same parts as in FIG. 5, and a detailed description thereof will be omitted.

This embodiment is substantially the same as the first embodiment, except that some electrodes of portions 35-1, 35-2, and 35-3 constituting an output transducer 35 are integrally formed by printed wiring lines on a substrate 31, and are directly connected to each other.

In this embodiment, the same operation and effect as those in the first embodiment can be obtained.

Furthermore, in this embodiment, since no wires for connecting the portions 35-1, 35-2, and 35-3 are required, an element manufacturing process can be simplified as compared to the first embodiment.

Figure 7:
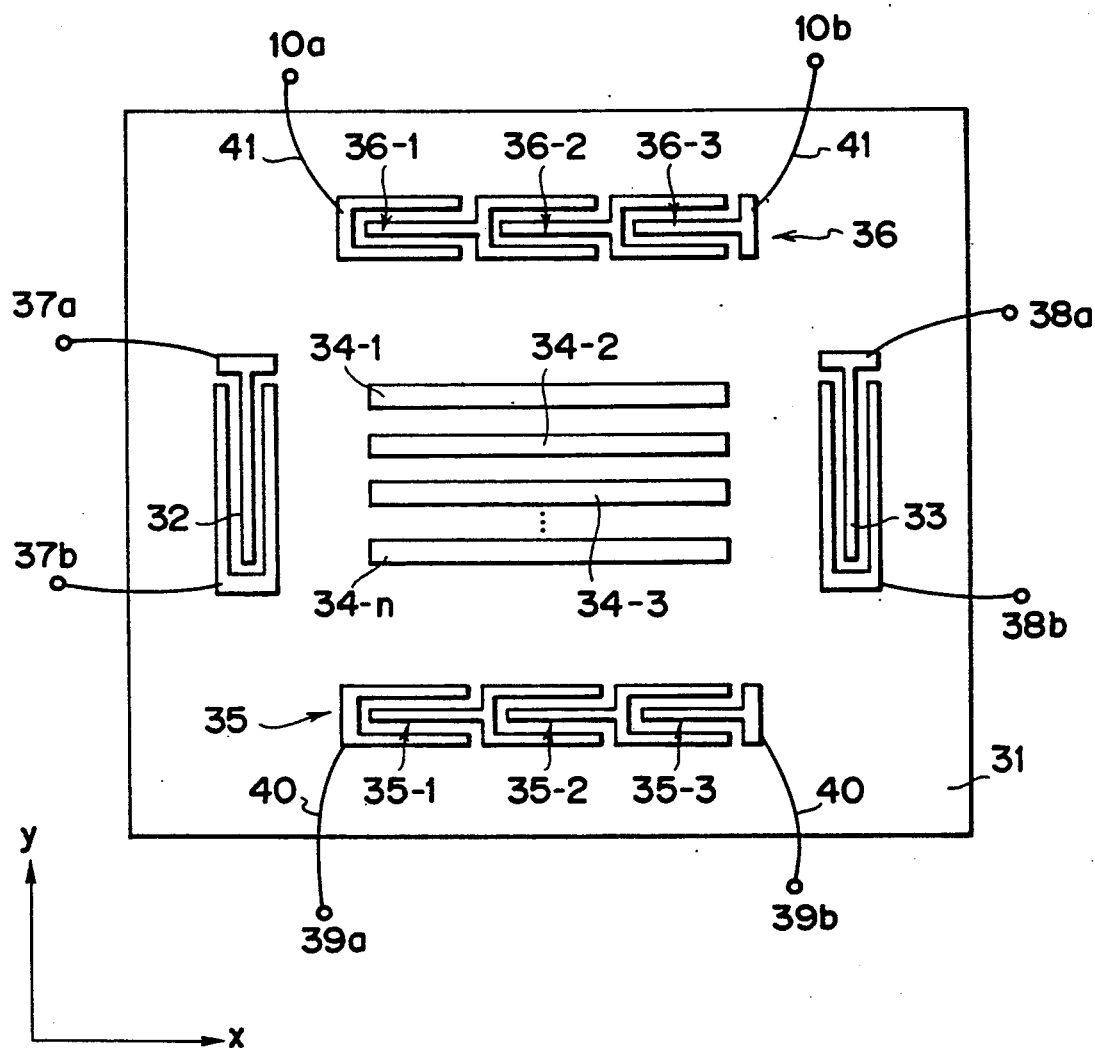

FIG. 7 is a schematic plan view showing the third embodiment of the surface acoustic wave device according to the present invention. The same reference numerals in FIG. 7 denote the same parts as in FIG. 6, and a detailed description thereof will be omitted.

This embodiment is substantially the same as the second embodiment, except that an output transducer 36 is formed on a substrate on the side opposite to an output transducer 35 to sandwich waveguides 34-1 to 34-n therebetween. The output transducer 36 has the same structure as the transducer 35. More specifically, the transducer 36 is constituted by a plurality of portions 36-1, 36-2, and 36-3 which are connected in series with each other.

In this embodiment, surface acoustic waves propagating in a direction toward the transducer 35 (in the negative direction of the y axis) are converted into electrical signals by the transducer 35, and the electrical signals are extracted from output terminals 39$a$ and 39$b$ like in the first embodiment. On the other hand, the waveguides 34-1 to 34-n also transmit surface acoustic waves in a direction toward the transducer 36 (in the positive direction of the y axis). The surface acoustic waves are converted into electrical signals by the portions 36-1 to 36-3 of the output transducer 36. The output signals from the portions 36-1 to 36-3 are synthesized so that their electric fields have the same direction, and the synthesized signal is extracted from output terminals 10$a$ and 10$b$ via lead wires 41. The signals output from the four output terminals are added to each other, thus obtaining an output of the overall element. In this embodiment, since all the surface acoustic waves generated from the waveguides are received by the output transducers, and are converted into electrical signals, an output twice that in the second embodiment can be obtained.

In this embodiment, the transducers 35 and 36 are arranged to be separated by almost the same distances from the waveguides. However, when these transducers are arranged to be separated by different distances from the waveguides, two outputs having a time difference can be obtained from the two transducers.

In the first embodiment, an output transducer having the same structure as the transducer 5 may be arranged on the substrate on a side opposite to the transducer 5 to sandwich the waveguides therebetween.

In each of the above embodiments, the output transducer is constituted by three portions. However, the number of portions is not limited to three. For example, the output transducer may be constituted by two or four or more portions. In this manner, the number of portions constituting the output transducer can be appropriately selected, and the same applies to all the following embodiments.

Figure 8:
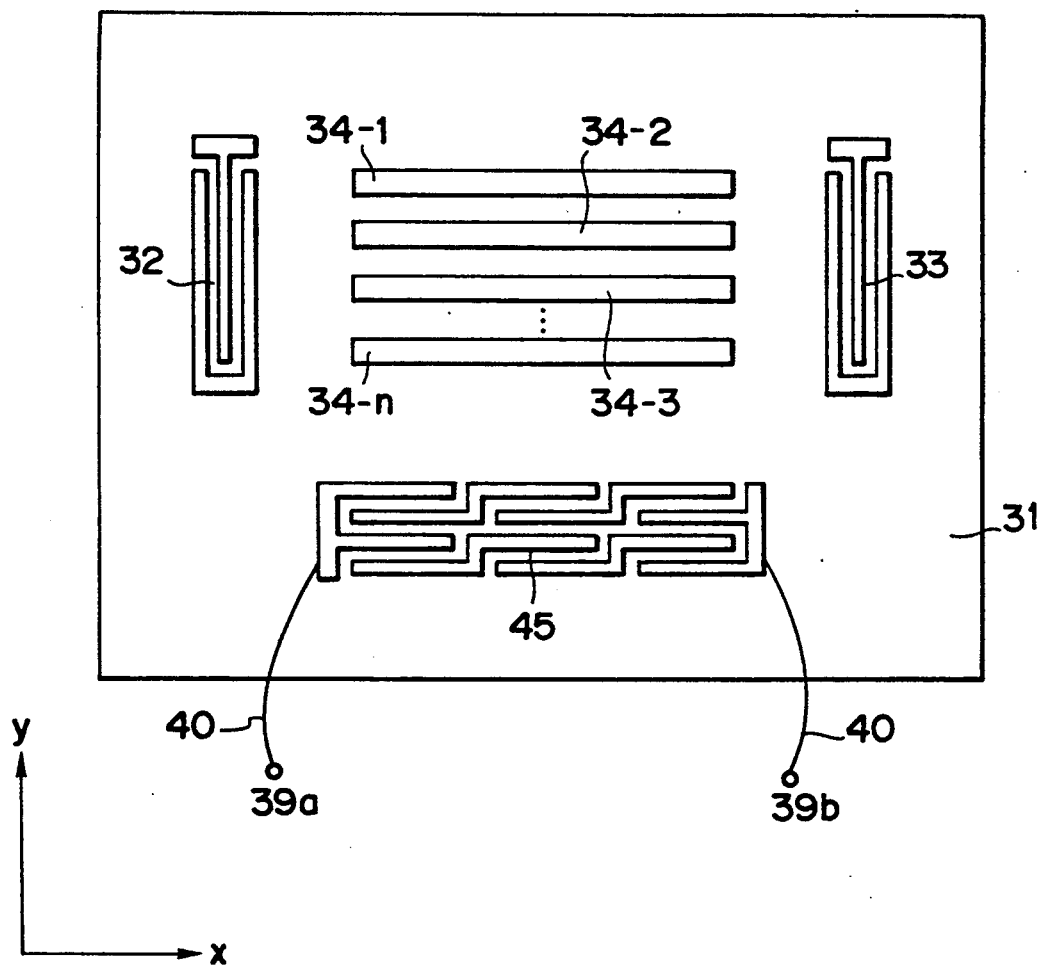

FIG. 8 is a schematic plan view showing the fourth embodiment of the surface acoustic wave element according to the present invention. The same reference numerals in FIG. 8 denote the same parts as in FIG. 5, and a detailed description thereof will be omitted.

The surface acoustic wave element of this embodiment is substantially the same as that in the first embodiment, except that an output transducer 45 comprises a so-called doglegged interdigital electrode. The doglegged electrode can be regarded as an interdigital electrode, which has a portion where electrode fingers intersect as one unit (section), and is constituted by connecting a plurality of sections in series with each other. The doglegged electrode is described in detail in K. L. Larkin et al., IEEE Trans. MTT. Vol. MTT-22, No. 8, pp. 763-768 (1974).

In this embodiment, the same operation and effect as those in the first embodiment can be obtained. The radiation resistance of the doglegged interdigital electrode is proportional to the square of the number of doglegged sections. On the other hand, the electrode resistance is almost constant regardless of the number of sections. Therefore, for example, when a doglegged interdigital electrode having three sections is used as the output transducer, the ratio of the radiation resistance to the electrode resistance is nine times that in a case using a conventional interdigital electrode, and a loss caused by the electrode resistance can be relatively decreased, thereby improving characteristics of the element.

Figure 9:
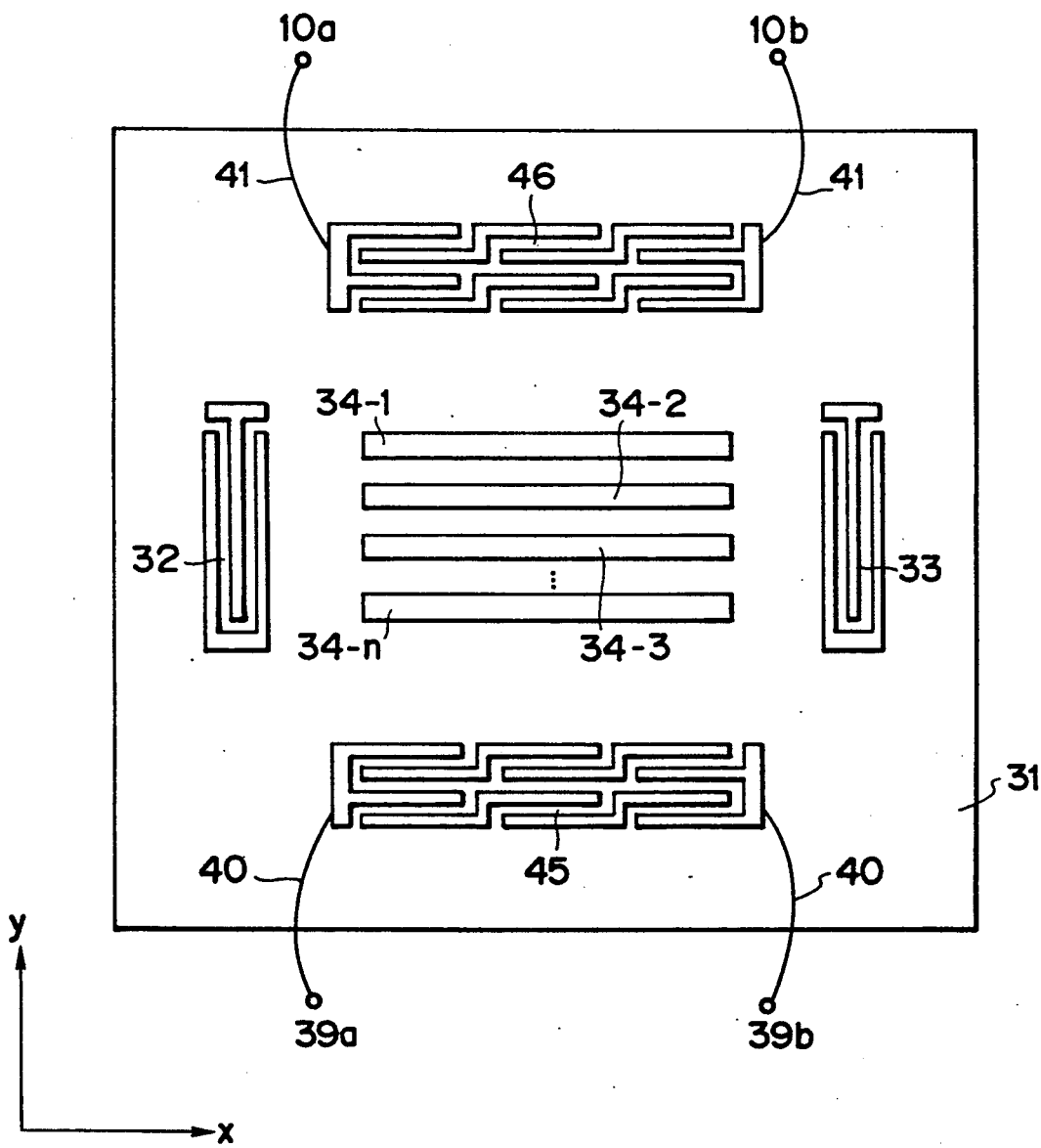

FIG. 9 is a schematic plan view showing the fifth embodiment of the surface acoustic wave device according to the present invention. The same reference numerals in FIG. 9 denote the same parts as in FIG. 8, and a detailed description thereof will be omitted.

This embodiment is substantially the same as the fourth embodiment, except that an output transducer 46 is arranged on a substrate on the side opposite to an output transducer 45 to sandwich waveguides 34-1 to 34-n therebetween. The output transducer 46 has the same structure as the transducer 45. More specifically, the transducer 46 comprises a doglegged interdigital electrode.

In this embodiment, surface acoustic waves propagating in a direction toward the transducer 45 (in the negative direction of the y axis) are converted into electrical signals by the transducer 45 like in the fourth embodiment, and the electrical signals are extracted from output terminals 39a and 39b. On the other hand, the waveguides 34-1 to 34-n cause surface acoustic waves to propagate in a direction toward the transducer 46 (in the positive direction of the y axis). The surface acoustic waves are converted into electrical signals by the output transducer 46, and the electrical signals are extracted from output terminals 10a and 10b via lead wires 41. The signals extracted from these four output terminals are added to each other to obtain an output of the overall element. In this embodiment, since all the surface acoustic waves generated from the waveguides are received by the output transducers, and are converted into electrical signals, an output twice that in the fourth embodiment can be obtained.

In this embodiment, the transducers 45 and 46 are arranged to be separated by almost the same distances from the waveguides. However, when these transducers are arranged to be separated by different distances from the waveguides, two outputs having a time difference can be obtained from the two transducers.

In each of the above embodiments, a plurality of portions of the output transducer are connected in series with each other, but may be connected in parallel with each other so that electric fields of signals output from these portions are synthesized in the same direction. This embodiment will be described below.

Figure 10:
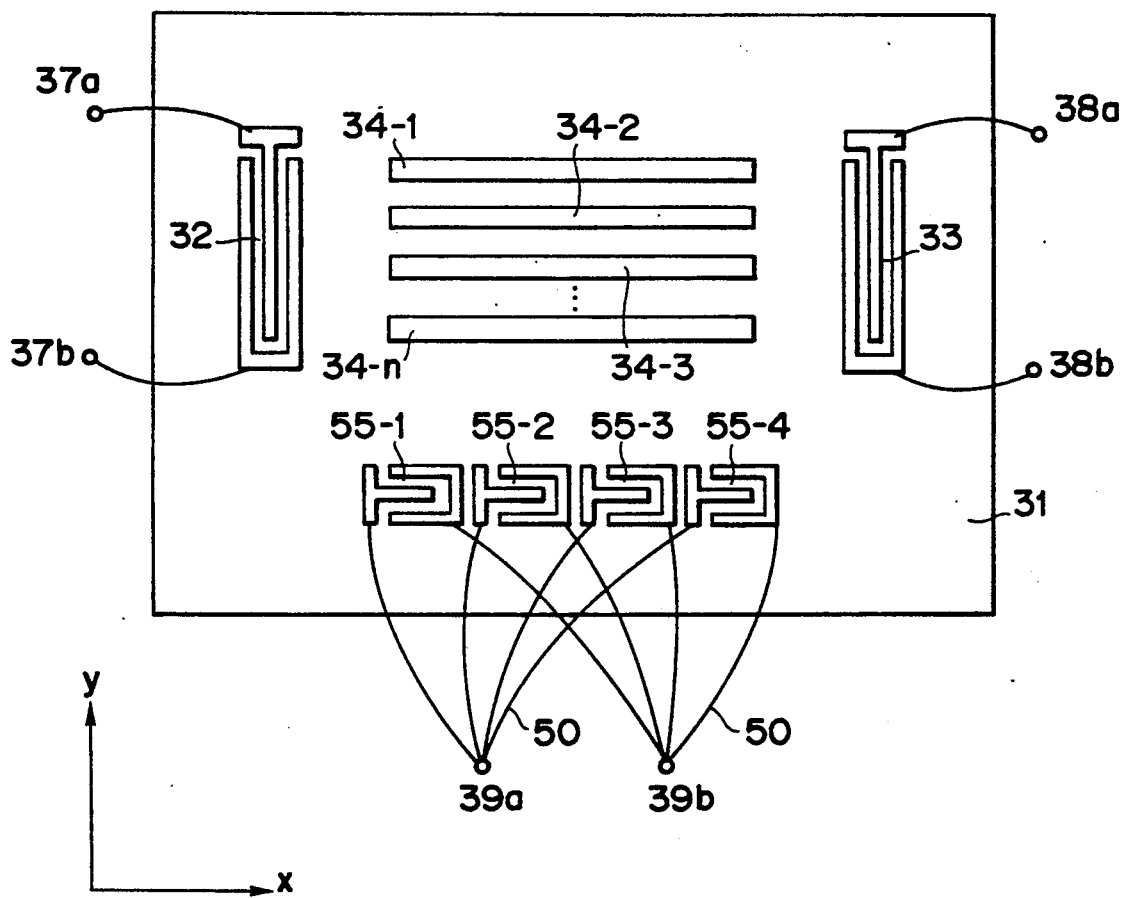

FIG. 10 is a schematic plan view showing the sixth embodiment of the surface acoustic wave device according to the present invention. The same reference numerals in FIG. 10 denote the same parts as in FIG. 5, and a detailed description thereof will be omitted.

This embodiment is substantially the same as the first embodiment, except that an output transducer 55 for converting surface acoustic waves generated from waveguides 34-1 to 34-n into electrical signals is constituted by four portions 55-1, 55-2, 55-3, and 55-4, and these portions are electrically connected in parallel with each other. These portions 55-1 to 55-4 comprise interdigital electrodes. One electrode of each of these interdigital electrodes is connected to an output terminal 39a via a lead wire (conductive wire) 50. The other electrode of each of these interdigital electrodes is connected to an output terminal 39b via the lead wire 50.

In this embodiment, surface acoustic waves generated from the waveguides 34-1 to 34-n are converted into electrical signals by the portions 55-1 to 55-4 of the output transducer 55. The output signals from these portions are synthesized, so that their electric fields are directed in the same direction, and the synthesized signal is extracted from the output terminals 39a and 39b.

In this embodiment, the electrode resistance of the output transducer can be decreased like in the first embodiment. In this embodiment, since the portions 55-1 to 55-4 are connected in parallel with each other, the output signals from the respective portions reach the output terminals 39a and 39b without causing almost no time difference.

Figure 11:
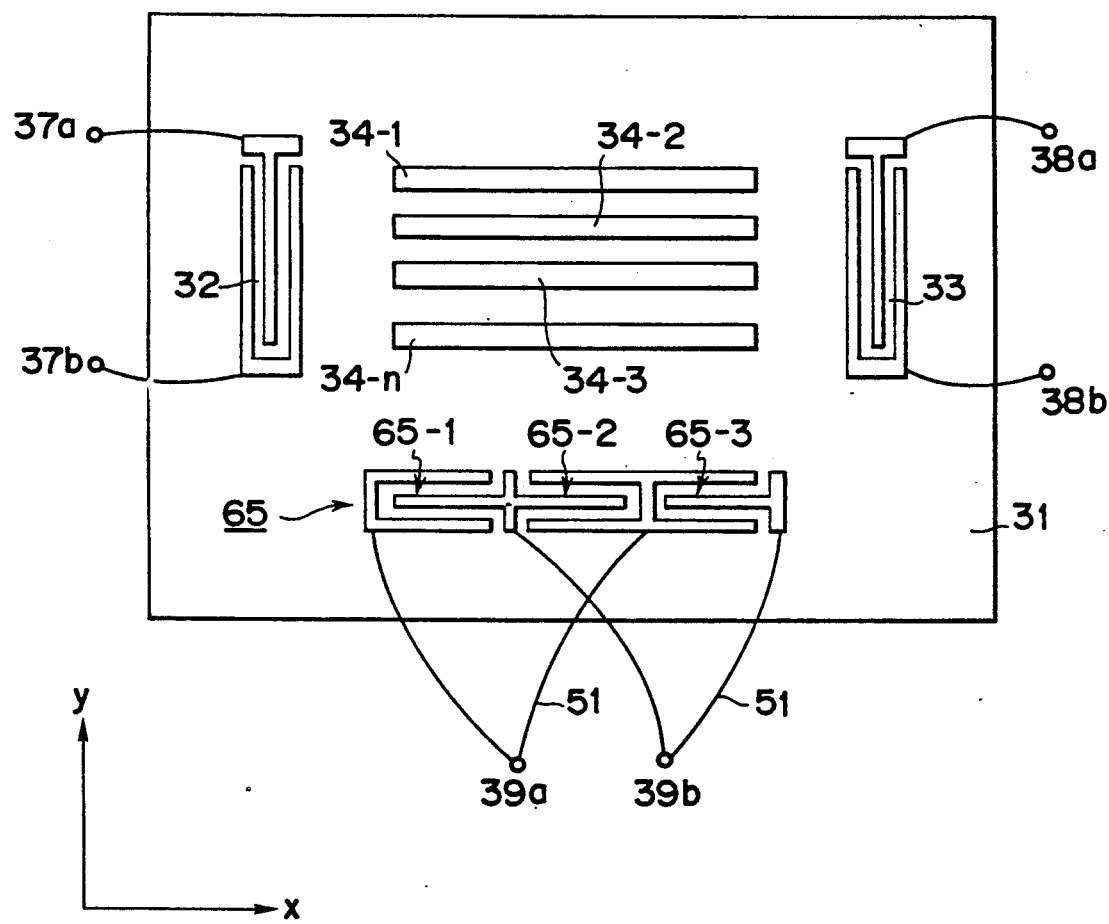

FIG. 11 is a schematic plan view showing the seventh embodiment of the surface acoustic wave device according to the present invention. The same reference numerals in FIG. 11 denote the same parts as in FIG. 10, and a detailed description thereof will be omitted.

In this embodiment, an output transducer 65 for converting surface acoustic waves generated from waveguides 34-1 to 34-n into electrical signals is constituted by three portions 65-1, 65-2, and 65-3. These portions comprise interdigital electrodes. One electrode of each of these interdigital electrodes is formed integrally with the electrode of another interdigital electrode. More specifically, the interdigital electrodes are connected by printed wiring lines. These portions 65-1 to 65-3 are electrically connected in parallel with each other by lead wires 51. Output signals from these portions are synthesized, so that their electric fields are directed in the same direction, and the synthesized signal is extracted from output terminals 39a and 39b.

In this embodiment, the same operation and effect as in the sixth embodiment can be obtained. In this embodiment, since the number of lead wires can be decreased, the device manufacturing process can be simplified as compared to the sixth embodiment.

Figure 12:
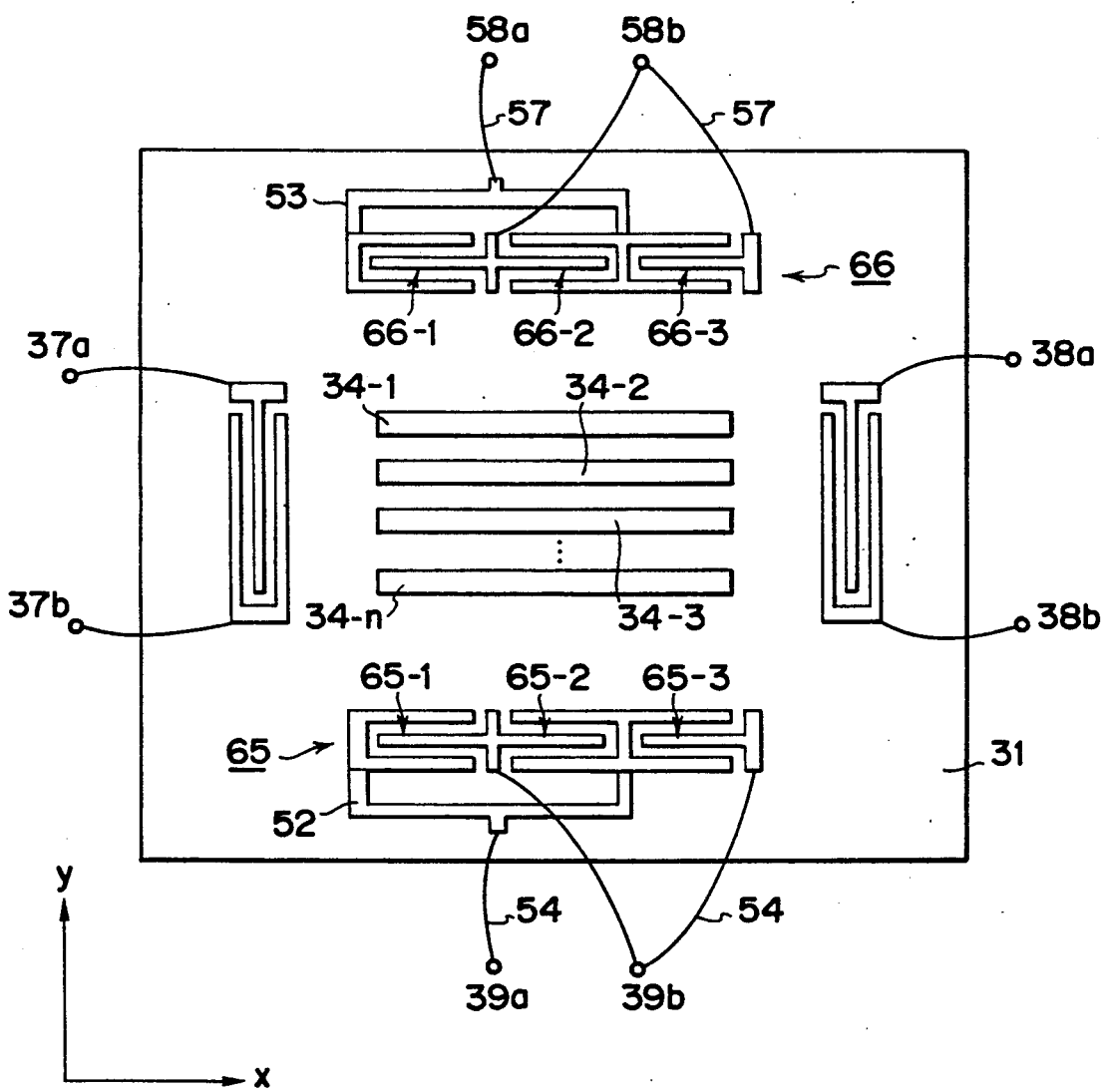

FIG. 12 is a schematic plan view showing the eighth embodiment of the surface acoustic wave element according to the present invention. The same reference numerals in FIG. 12 denote the same parts as in FIG. 11, and a detailed description thereof will be omitted.

This embodiment is substantially the same as the seventh embodiment, except that an output transducer 66 is arranged on a substrate on the side opposite to an output transducer 65 to sandwich waveguides 34-1 to 34-n therebetween. The output transducer 66 has the same structure as the transducer 65. More specifically, the transducer 66 is constituted by three portions 66-1 to 66-3.

In this embodiment, signals are extracted from the output transducer 65 via a printed wiring line 52 and lead wires 54. On the other hand, the output transducer 66 outputs signals to output terminals 58a and 58b via a printed wiring line 53 and lead wires 57. In this manner, since the printed wiring lines are used, the number of lead wires can be decreased, and the element manufacturing process can be further simplified.

In this embodiment, surface acoustic waves transmitted in the negative direction of the y axis are converted into electrical signals by the transducer 65, and the electrical signals are extracted from output terminals 39a and 39b like in the seventh embodiment. On the other hand, surface acoustic waves transmitted in the positive direction of the y axis from the waveguides 34-1 to 34-n are converted into electrical signals by the output transducer 66, and the electrical signals are extracted from the output terminals 58a and 58b. The signals extracted from these output terminals are added to each other to obtain an output of the overall element. In this embodiment, since all the surface acoustic waves generated from the waveguides are received by the output transducers, and are converted into electrical signals, an output twice that in the seventh embodiment can be obtained.

In this embodiment, the transducers 65 and 66 are arranged to be separated by almost the same distances from the waveguides. However, when these transducers are arranged to be separated by different distances from the waveguides, two outputs having a time difference can be obtained form the two transducers.

Furthermore, according to the present invention, some of a plurality of portions of the output transducer may be connected in series with each other, and the remaining portions may be connected in parallel with each other. This embodiment will be described below.

Figure 13:
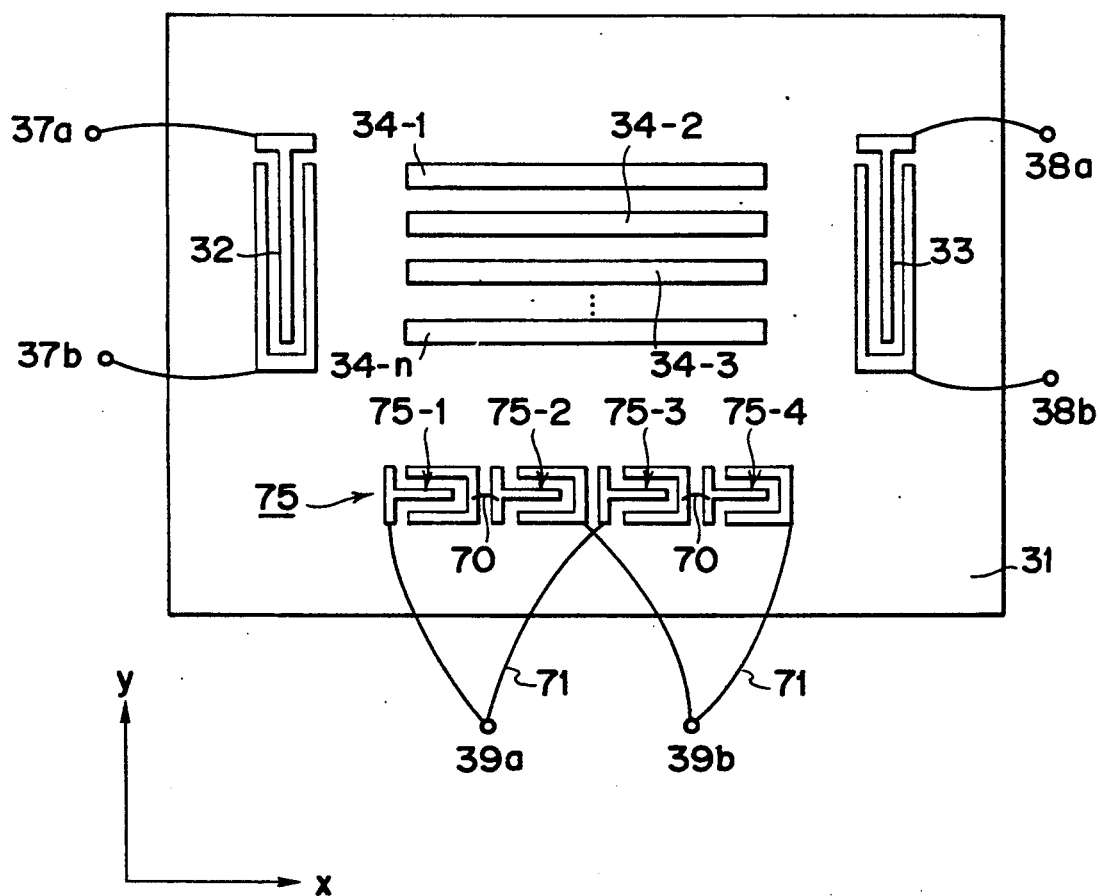

FIG. 13 is a schematic plan view showing the ninth embodiment of the surface acoustic wave device according to the present invention. The same reference numerals in FIG. 13 denote the same parts as in FIG. 5, and a detailed description thereof will be omitted.

In this embodiment, an output transducer 75 for converting surface acoustic waves generated from waveguides 34-1 to 34-n into electrical signals is constituted by four portions 75-1, 75-2, 75-3, and 75-4. The portions 75-1 and 75-2, and the portions 75-3 and 75-4 are electrically connected in series with each other by wires 70, respectively. Two pairs of the series-connected portions (75-1 and 75-2) and (75-3 and 75-4) are electrically connected in parallel with each other via lead wires 71.

In this embodiment, surface acoustic waves generated from the waveguides 34-1 to 34-n are converted into electrical signals by the portions 75-1 to 75-4 of the output transducer 75. The output signals from the respective portions are synthesized, so that their electric fields are directed in the same direction, and the synthesized signal is extracted from output terminals 39a and 39b.

In this embodiment, the electrode resistance of the output transducer can be decreased in the same manner as in the first embodiment. If an impedance $Z_i$ of the portions 75-1 to 75-4 of this embodiment is given by:

$$Z_i = R_i + jX_i$$

(where $R_i$ is the real part of the impedance, $X_i$ is the imaginary part of the impedance, j is the imaginary unit, and i=1, 2, 3, 4) then, the overall impedance is expressed by:

$$1/Z = 1/(Z_1 + Z_2) + 1/(Z_3 + Z_4)$$

When series and parallel connections are appropriately combined like in this embodiment, the impedance of the output transducer can be adjusted to a desired value. Therefore, when the impedance of the output transducer is adjusted to become close to that of an external circuit, the impedance matching with the external circuit can be easily attained.

Figure 14:
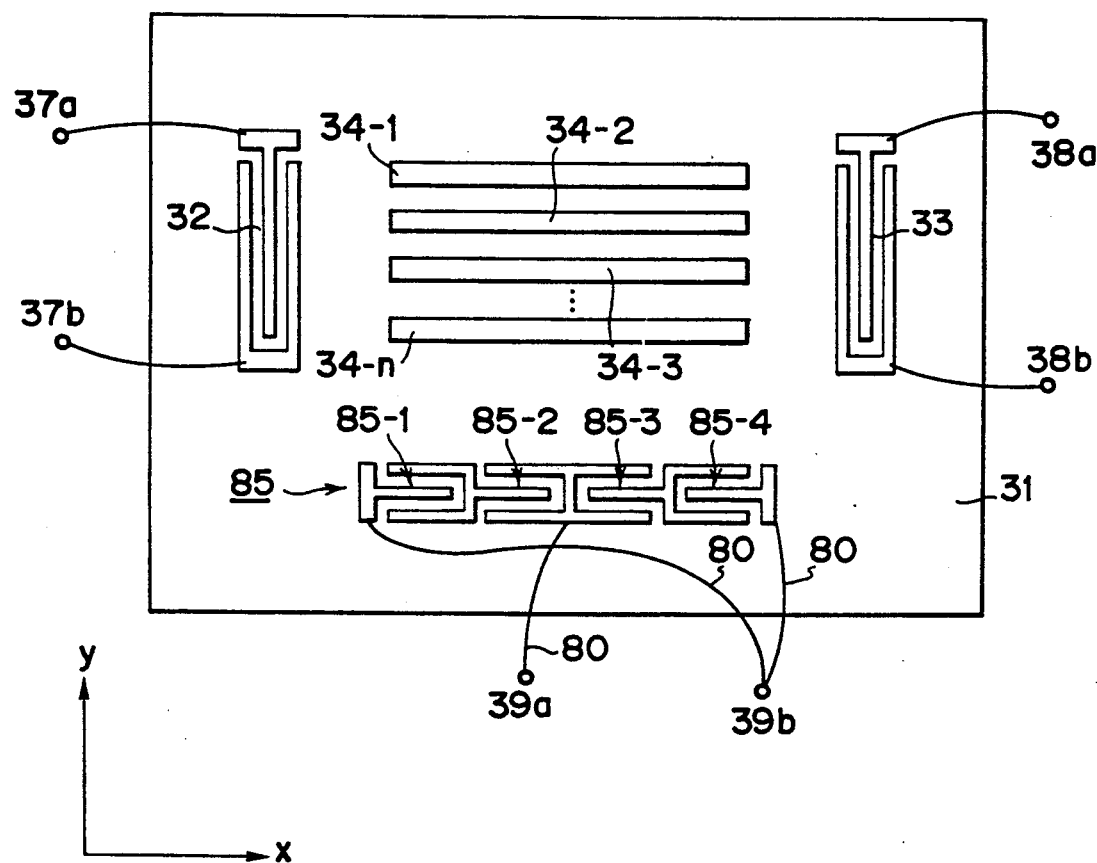

FIG. 14 is a schematic plan view showing the tenth embodiment of the surface acoustic wave device according to the present invention. The same reference numerals in FIG. 14 denote the same parts as in FIG. 13, and a detailed description thereof will be omitted.

In this embodiment, an output transducer 85 for converting surface acoustic waves generated from waveguides 34-1 to 34-n into electrical signals is constituted by four portions 85-1, 85-2, 85-3, and 85-4. These portions comprise comb electrodes. One electrode of each of these comb electrodes is formed integrally with an electrode of another comb electrode. More specifically, the comb electrodes are connected by printed wiring lines. Two pairs of portions (85-1 and 85-2) and (85-3 and 85-4) are electrically connected in parallel with each other by lead wires 80. The output signals from these portions are synthesized, so that their electric fields are directed in the same direction, and the synthesized signal is extracted from output terminals 39a and 39b.

In this embodiment, the same operation and effect as in the ninth embodiment can be obtained. Since the number of lead wires can be decreased, the element manufacturing process can be simplified in addition to the effect of the ninth embodiment.

Figure 15:
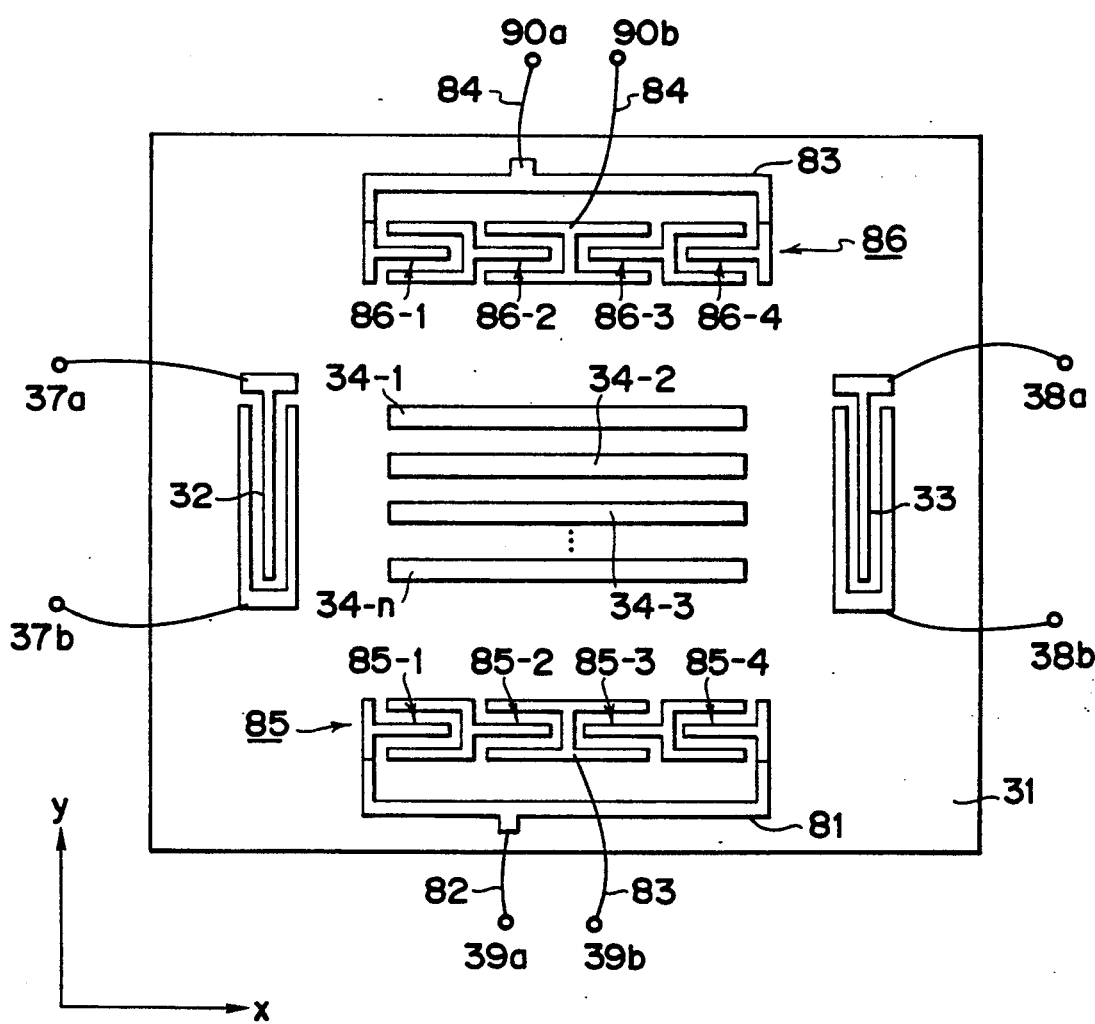

FIG. 15 is a schematic plan view showing the eleventh embodiment of the surface acoustic wave device according to the present invention. The same reference numerals in FIG. 15 denote the same parts as in FIG. 14, and a detailed description thereof will be omitted.

This embodiment is substantially the same as the tenth embodiment, except that an output transducer 86 is arranged on a substrate on the side opposite to an output transducer 85 to sandwich waveguides 34-1 to 34-n therebetween. The transducer 86 has the same structure as the transducer 85. More specifically, the transducer 86 is constituted by four portions 86-1 to 86-4.

In this embodiment, signals are extracted from the output transducer 85 via a printed wiring line 81 and lead wires 82. On the other hand, the output transducer 86 outputs signals to output terminals 90a and 90b via a printed wiring line 83 and lead wires 84. In this manner, since the printed wiring lines are used, the number of lead wires can be decreased, and the element manufacturing process can be further simplified.

In this embodiment, surface acoustic waves transmitted in the negative direction of the y axis are converted into electrical signals by the transducer 85, and the electrical signals are extracted from output terminals 39a and 39b like in the tenth embodiment. On the other hand, surface acoustic waves propagating in the positive direction of the y axis from the waveguides 34-1 to 34-n are converted into electrical signals by the output transducer 86, and the electrical signals are extracted from the output terminals 90a and 90b. The signals extracted from these output terminals are added to each other to obtain an output of the overall element. In this embodiment, since all the surface acoustic waves generated from the waveguides are received by the output transducers, and are converted into electrical signals, an output twice that in the tenth embodiment can be obtained.

In this embodiment, the transducers 85 and 86 are arranged to be separated by almost the same distances from the waveguides. However, when these transducers are arranged to be separated by different distances from the waveguides, two outputs having a time difference can be obtained from the two transducers.

The electrical resistance of the surface acoustic wave device of the present invention will be described below. The following description can be applied to any of the first to eleventh embodiments. In this case, a description will be made using the element shown in FIG. 10.

In the element shown in FIG. 10, the portions 55-1, 55-2, 55-3, and 55-4 of the output transducer are respectively normalized comb electrodes. A radiation resistance $R_a$ of the comb electrode at the center frequency is given by the following equation:

$$R_a = 2 \cdot K^2 / (\pi^2 \cdot f \cdot \epsilon \cdot w) \quad (3)$$

where w is the maximum intersection width of the comb electrode, $K^2$ is the electro-mechanical coupling coefficient of the piezoelectric substrate, f is the operating frequency, and $\epsilon$ is the permittivity of the piezoelectric substrate.

On the other hand, an electrode resistance $R_e$ of the comb electrode is given by the following equation:

$$R_e = (2 \cdot r \cdot w)/(d \cdot h \cdot N) \quad (4)$$

where r is the resistivity of the comb electrode, w is the maximum intersection width of the comb electrode, d is the line width of the comb electrode, h is the film thickness of the comb electrode, and N is the number of electrode fingers constituting the comb electrode.

FIG. 16 is a graph showing the relationship among the radiation resistance $R_a$, the electrode resistance $R_e$, and a loss caused by the electrode resistance $R_e$. As shown in FIG. 16, the radiation resistance $R_a$ is inversely proportional to the maximum intersection width w, and the electrode resistance $R_e$ is proportional to the maximum intersection width w.

As shown in FIG. 16, when an intersection width $w_0$ satisfies $3R_a = R_e$, a loss caused by the electrode finger resistance is about 6 dB.

Therefore, when the output transducer is formed to satisfy $3R_a > R_e$, i.e., the following relation from equations (3) and (4):

$$(r \cdot w)/(d \cdot h \cdot N) < 3 \cdot K^2/(\pi^2 \cdot f \cdot \epsilon \cdot w) \quad (5)$$

the loss caused by the electrode resistance can be suppressed below 6 dB.

Thus, according to this embodiment, when the output transducer is constituted by using interdigital electrodes each satisfying $3R_a > R_e$, i.e., each of which has the radiation resistance $R_a$ substantially larger than ⅓ the electrode resistance $R_e$, the loss caused by the electrode resistance can be decreased.

The reason why $3R_a > R_e$ is substantially satisfied is that the intersection width w of the comb electrode satisfying this condition is smaller than $w_0$, as shown in the graph of FIG. 16, and it is most preferable in view of the structure, manufacture, and efficiency of an acoustic-electric transducer constituted by a plurality of comb electrodes.

In this embodiment, when each of the portions 55-1, 55-2, 55-3, and 55-4 of the output transducer is formed by a 6-pair aluminum comb electrode having an intersection width of 5 mm, a line width of 4.4 μm, and a film thickness of 0.3 μm, the electrode resistance $R_e$ per portion is about 17Ω, and the radiation resistance $R_a$ per portion is about 9.6Ω, thus satisfying the condition of $3R_a > R_e$.

Figure 1:
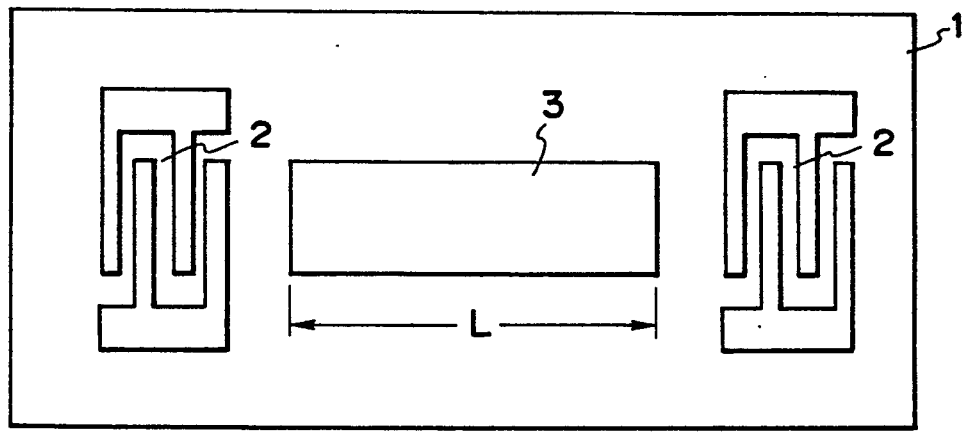
FIGS. 1 and 2 are schematic plan views showing conventional surface acoustic wave devices.
Figure 2:
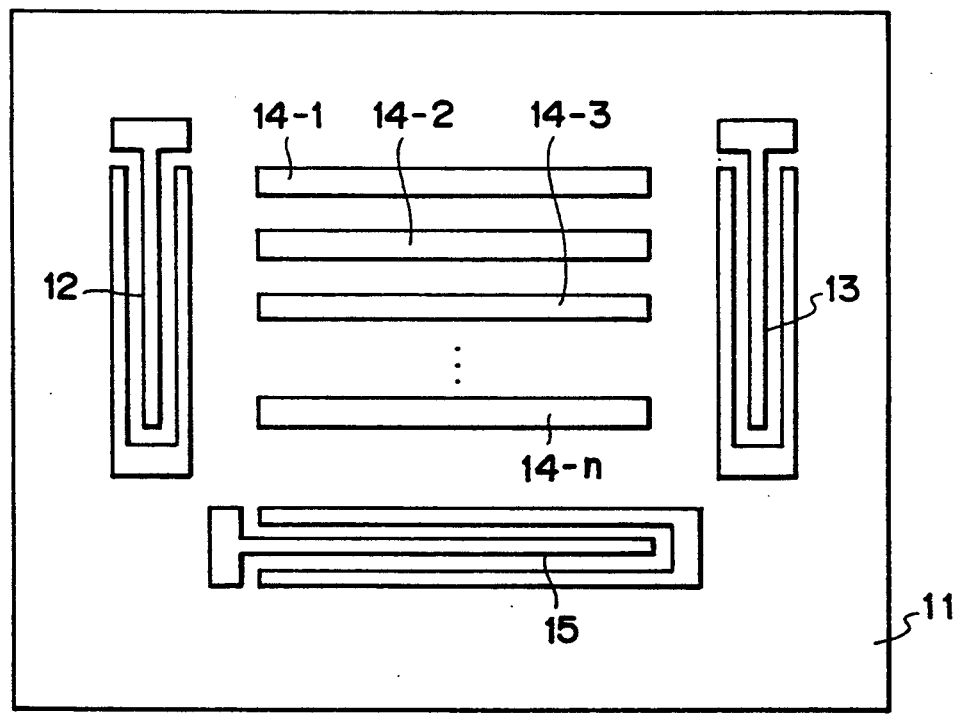
Figure 3:
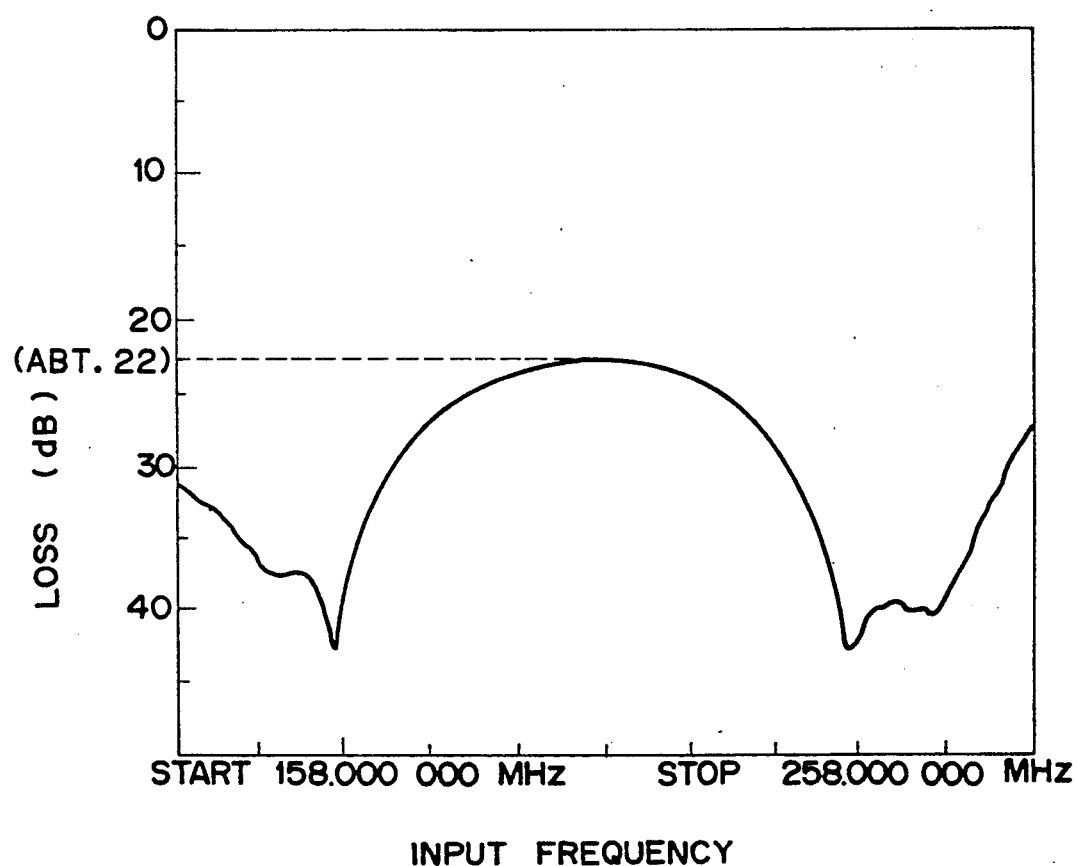
FIG. 3 is a graph showing a conversion loss of an output transducer in the device shown in FIG. 2.
Figure 4:
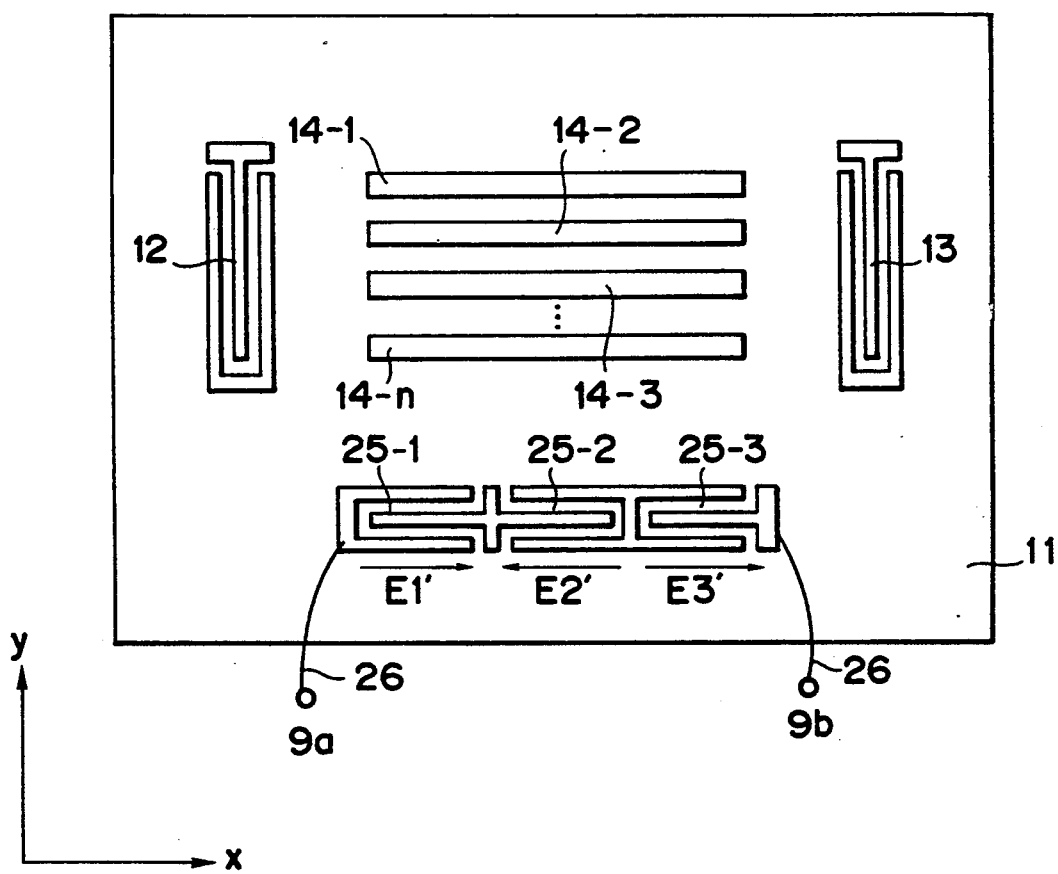
FIG. 4 is a schematic plan view showing still another conventional surface acoustic wave device.

When the conversion loss of the output transducer constituted by the portions 55-1, 55-2, 55-3, and 55-4 was measured, it was about 11 dB, as shown in FIG. 17. Thus, the loss can be reduced by about 11 dB as compared to about 22 dB of the conventional element shown in FIG. 3, and efficiency can be improved.

Figure 18:
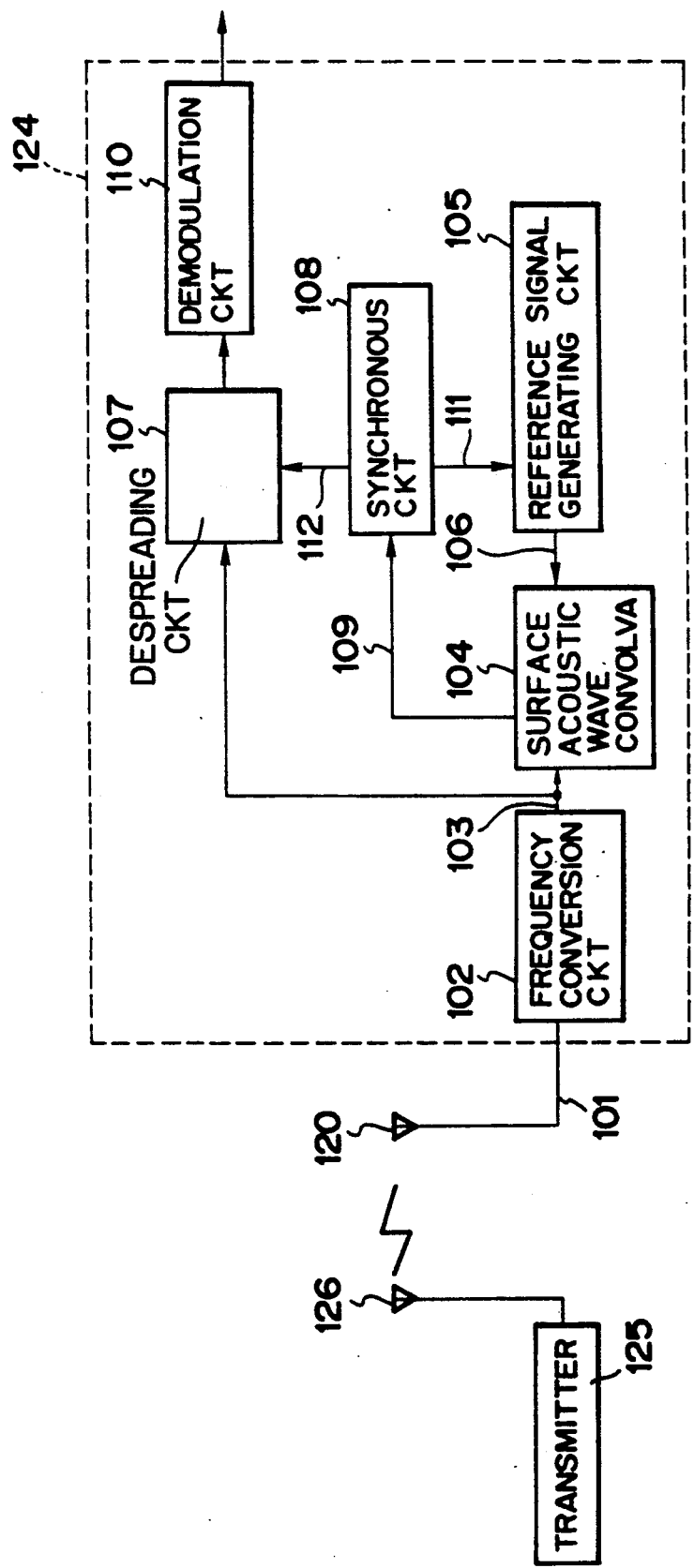
FIG. 18 is a block diagram showing a communication system using the surface acoustic wave device of the present invention.

FIG. 18 is a block diagrams showing a communication system using the surface acoustic wave element device described above as a convolver. In FIG. 18, a transmitter 125 transmits a spread-spectrum signal from an antenna 126. The transmitted signal is received by an antenna 120 of a receiver 124, and a reception signal 101 is input to a frequency conversion circuit 102. An IF signal 103 converted by the frequency converter 102 to have a frequency matching with the input frequency of a surface acoustic wave convolver 104 is input to the convolver 104 comprising the surface acoustic wave element of the present invention shown in FIGS. 5 to 15. The IF signal 103 is input to one input transducer of the convolver, e.g., the transducer 32 shown in FIG. 5.

On the other hand, a reference signal 106 output from a reference signal generating circuit 105 is input to the other input transducer of the convolver 104, e.g., the transducer 33 shown in FIG. 5. The convolver 104 performs a convolution calculation (correlation calculation) between the IF signal 103 and the reference signal 106, and an output signal (convolution signal) 109 is output from an output transducer, e.g., the transducer 5 shown in FIG. 5. The output signal 109 is input to a synchronous circuit 108. The synchronous circuit 108 generates synchronous signals 111 and 112 on the basis of the output signal 109 from the surface acoustic wave convolver 104, and inputs them to the reference signal generating circuit 105 and a despreading circuit 107.

Figure 19:
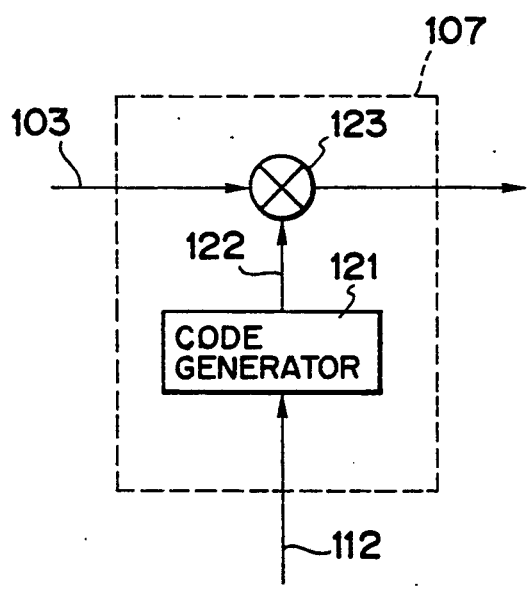
FIG. 19 is a block diagram showing a detailed arrangement of an inverse spread circuit shown in FIG. 18.

The reference signal generating circuit 105 adjusts the timing of the reference signal 106 using the synchronous signal 111, and outputs the adjusted signal 106. The despreading circuit 107 restores the IF signal 103 to a signal before it is spectrum-spread using the synchronous signal 112. This signal is converted into an information signal by a demodulation circuit 110, and the information signal is output. FIG. 19 shown an arrangement of the despreading circuit 107. In FIG. 19, the circuit 107 is constituted by a code generator 121 and a multiplier 123. The code generator 121 receives the synchronous signal 112 from the synchronous circuit 108, and generates a code 122 whose timing is adjusted based on the synchronous signal 112. The multiplier 123 receives the IF signal 103 and the code 122, and outputs a product of the IF signal 103 and the code 122. In this case, if the timing of the IF signal 103 coincides with that of the code 122, the IF signal 103 is converted into a signal before it is spectrum-spread, and the converted signal is output.

When the frequency of the reception signal 101 is matched with the input frequency of the surface acoustic wave convolver 104, the frequency conversion circuit 102 can be omitted, and the reception signal 101 can be directly input to the surface acoustic wave convolver 104 via an amplifier and a filter. The amplifier and the filter are omitted from FIG. 18 for the sake of simplicity. However, the amplifier and the filter may be inserted before or after each block, as needed. Furthermore, in this embodiment, the transmission signal is received by the antenna 120. However, the transmitter and the receiver may be directly connected via a cable system without using the antenna 120.

Figure 20:
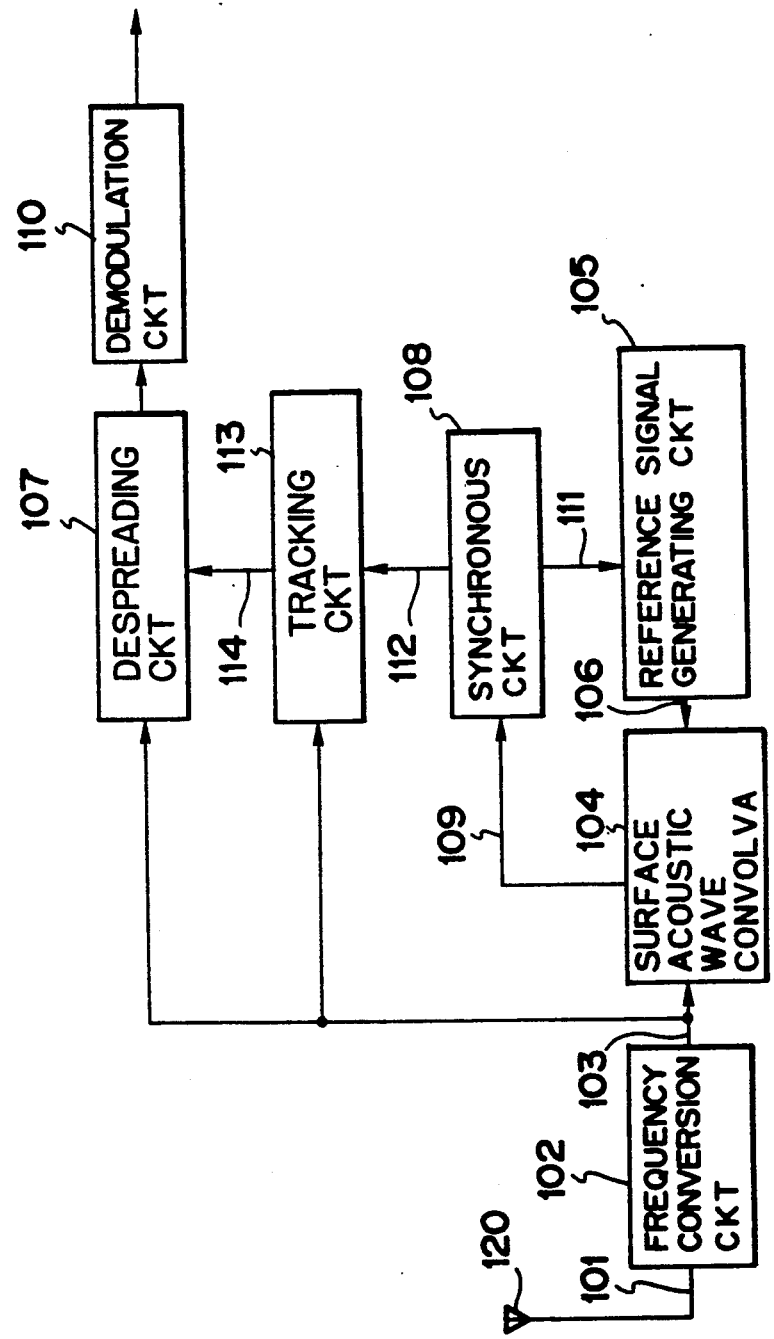
FIGS. 20 to 22 are block diagrams showing modifications of a receiver shown in FIG. 18.

FIG. 20 is a block diagram showing the first modification of the receiver 124 in the communication system shown in FIG. 18. The same reference numerals in FIG. 20 denote the same parts as in FIG. 18, and a detailed description thereof will be omitted.

In this modification, a tracking circuit 113 is added, and the IF signal 103 is also input to the synchronization following circuit 113. The synchronous signal 112 output from the synchronous circuit 108 is input to the synchronization following circuit 113, and a synchronous signal 114 output from the synchronization following circuit 113 is input to the despreading circuit 107. These blocks are different from the embodiment shown in FIG. 18. As the synchronization following circuit, a tau dither loop circuit or a delayed locked loop circuit may be used.

In this modification, the same operation and effect as in FIG. 18 can be obtained. Furthermore, in this modification, after the synchronous circuit 108 attains rough synchronization, the synchronization following circuit 113 attains precise synchronization, and performs a synchronization following operation. Therefore, a step-out is not easy to occur, and an error rate can be decreased.

Figure 21:
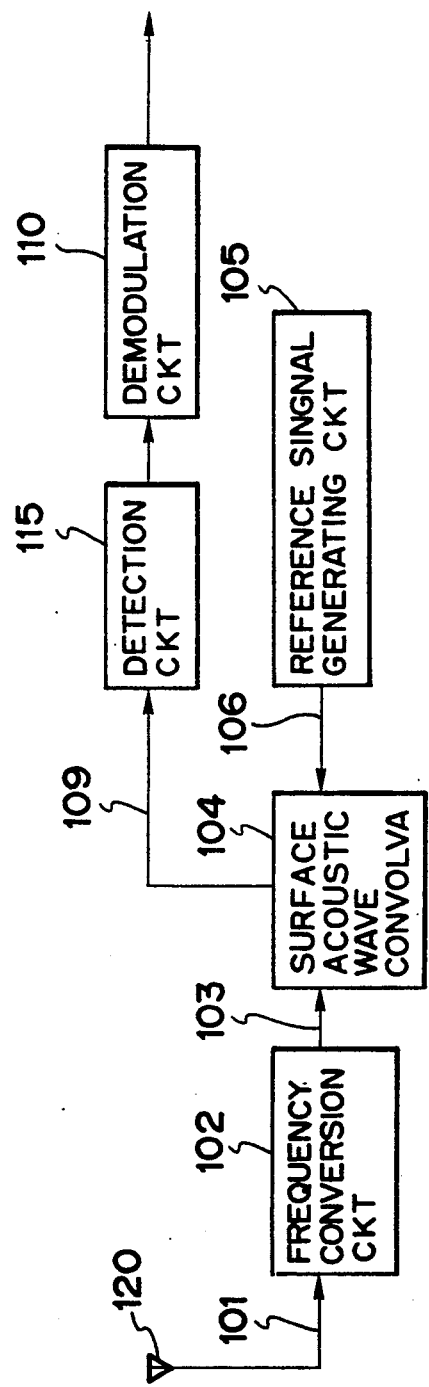

FIG. 21 is a block diagram showing the second modification of the receiver 124 in the communication system shown in FIG. 18. The same reference numerals in FIG. 21 denote the same parts as in FIG. 18, and a detailed description thereof will be omitted.

In this modification, an output from the surface acoustic wave convolver 104 is input to a detection circuit 115, and demodulation is performed based on the output from the detection circuit 115. The detection circuit 115 may comprise a synchronization detection circuit, a delay detection circuit, an envelope detection circuit, or the like, and these circuits may be selectively used depending on a signal modulation method.

Assuming that the reception signal 101 is a signal subjected to given modulation such as phase modulation, frequency modulation, amplitude modulation, or the like, the modulation information is reflected in the output 109 from the surface acoustic wave convolver 104. In particular, when the length d of the waveguides of the surface acoustic wave convolver 104 satisfies d=vT (where T is the time per bit of data of the reception signal 101, and v is the surface acoustic wave velocity), the modulation information appears in the output 109 as it is. For example, assume that a phase-modulated signal $f(t)\exp(j\theta)$ is transmitted, and is received as the reception signal 101.

In this case, when the reference signal g(t) 106 is input to the surface acoustic wave convolver 104, its output 109 is given by:

$$\int f(t)\exp(j\theta)g(\tau-t)dt = \exp(j\theta)\int f(t)g(\tau-t)dt \quad (6)$$

Thus, phase-modulation information appears. Therefore, when the output 109 form the surface acoustic wave convolver 104 is input to the proper detection circuit 115, the reception signal can be demodulated.

Figure 22:
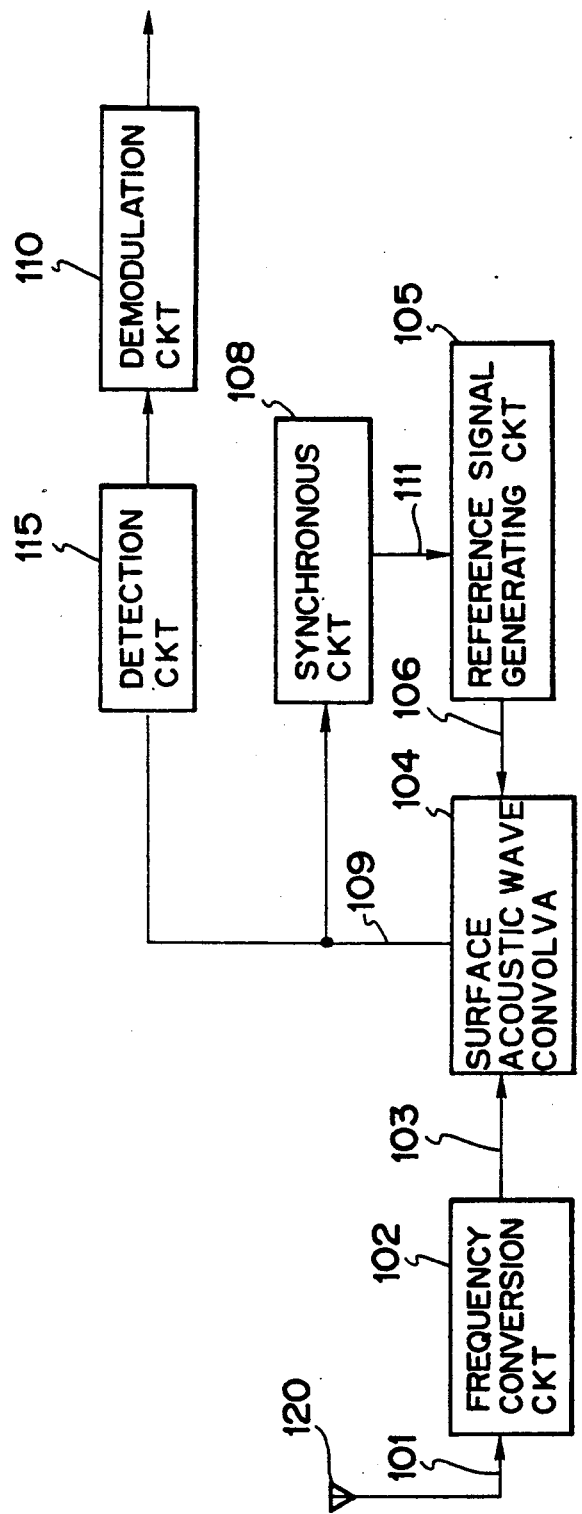

FIG. 22 is a block diagram showing the third modification of the receiver 124 in the communication system shown in FIG. 18. The same reference numerals in FIG. 22 denote the same parts as in FIG. 21, and a detailed description thereof will be omitted.

In this modification, a synchronous circuit 108 is arranged, and the output 109 from the surface acoustic wave convolver 104 is also input to the synchronous circuit 108. The synchronous circuit 108 outputs a synchronous signal 111, and inputs it to the reference signal generating circuit 105. These blocks are different form the arrangement shown in FIG. 21.

In this modification, the same operation and effect as in FIG. 21 can be obtained. However, in this modification, the synchronous circuit 108 is arranged, and the reference signal generating circuit 105 is controlled based on the synchronous signal 111 output from the synchronous circuit 108. Therefore, synchronization can be stably attained.

In addition to the above embodiments, various other applications of the present invention may be made. For example, when the comb electrode constituting the input transducer in each of the first to eleventh embodiments is constituted by a double electrode (split electrode), reflection of surface acoustic waves in the input transducer can be suppressed, and the characteristic of the element can be further improved.

Similarly, when the comb electrode constituting the output transducer is constituted by a double electrode (split electrode), reflection of surface acoustic waves in the output transducer can be suppressed, and the characteristics of the device can be further improved.

In each of the first to eleventh embodiments, the transducer employs an apologized comb electrode having a constant intersection width and pitch of electrode fingers. However, a weighted electrode such as an apodized electrode may be employed.

In each of the first to eleventh embodiments, the substrate is not limited to a single-crystal substrate formed of lithium niobate. For example, the substrate need only comprise a material or structure which can exhibit a parametric mixing effect, such as a structure constituted by adding a piezoelectric film on a semiconductor or a glass substrate.

In each of the first to eleventh embodiments, surface acoustic waves excited by the input transducers are directly guided to the surface acoustic wave waveguides. Beam width compressors such as horn waveguides or multistrip couplers may be arranged between the input transducers and the waveguides.

The present invention includes the above-mentioned applications within the scope of the appended claims.

Note that the coordinate axes illustrated in FIGS. 5 to 15 are added for the sake of easy understanding, and do not mean crystallographic axes of the substrate.

What is claimed is:

1. A surface acoustic wave device comprising:
    a piezoelectric substrate;
    a plurality of input transducers, formed on said substrate, for generating surface acoustic waves corresponding to input signals;
    a plurality of waveguides which are juxtaposed on a region of said substrate where the surface acoustic waves generated by said input transducers overlap each other, and in which signals are generated due to an interaction of the surface acoustic waves, said waveguides generating surface acoustic waves corresponding to the signals due to the interaction; and
    an output transducer for receiving the surface acoustic waves generated from said waveguides, converting the surface acoustic wave into electrical signals, and extracting the electrical signals, said output transducer being constituted by a plurality of portions, juxtaposed in a widthwise direction of the surface acoustic waves generated from said waveguides, for receiving some components of the surface acoustic waves generated from said waveguides, and outputting signals, said portions being connected to each other, so that electric fields of electrical signals output from said portions are synthesized in the same direction.

2. A device according to claim 1, wherein said output transducer comprises a plurality of comb electrodes connected to each other, a radiation resistance value of each of said comb electrodes being substantially larger than ⅓ an electrode resistance value of each of said comb electrodes.

3. A device according to claim 2, wherein said element satisfies the following condition:

$$\frac{r \cdot w}{d \cdot h \cdot N} < \frac{3K^2}{\pi^2 \cdot f \cdot \epsilon \cdot w}$$

where w is a maximum intersection width of the comb electrode, r is a resistivity of the comb electrode, d is a line width of the comb electrode, h is a film thickness of the comb electrode, N is the number of electrode fingers of the comb electrode, $K^2$ is an electro-mechanical coupling coefficient of said substrate, f is an operating frequency of said element, and $\epsilon$ is a permittivity of said substrate.

4. A device according to claim 1, wherein said plurality of portions of said output transducer are electrically connected in series with each other.

5. A device according to claim 1, wherein said plurality of portions of said output transducer are electrically connected in parallel with each other.

6. A device according to claim 1, wherein some of said plurality of portions of said output transducer are electrically connected in series with each other, and remaining portions are electrically connected in parallel with each other.

7. A device according to claim 1, wherein said output transducer comprises a doglegged comb electrode having at least two sections.

8. A device according to claim 1, wherein said plurality of portions of said output transducer are connected to each other by printed wiring lines formed on said substrate.

9. A device according to claim 1, wherein said waveguides generate the surface acoustic waves toward two sides of an arranging direction thereof, and said output transducer comprises first and second transducers for receiving the surface acoustic waves in two directions, each of said first and second transducers comprising a plurality of portions, juxtaposed in the widthwise direction of the surface acoustic waves generated from said waveguides, for receiving some components of the surface acoustic waves generated from said waveguides, and outputting signals.

10. A surface acoustic wave device comprising:
    a piezoelectric substrate;
    a first input transducer, formed on said substrate, for generating a first surface acoustic wave propagating in a first direction in accordance with a first input signal;
    a second input transducer, formed on said substrate, for generating a second surface acoustic wave transmitted in a second direction in accordance with a second input signal;
    a plurality of waveguides which are juxtaposed on a region of said substrate where the first and second surface acoustic waves overlap each other, and in which a convolution signal of the first and second input signals is generated due to an interaction of the surface acoustic waves, said waveguides generating a third surface acoustic wave corresponding to the third surface acoustic wave; and
    an output transducer for receiving the third surface acoustic wave, converting the convolution signal into an electrical signal, and outputting the electrical signal, said output transducer comprising a plurality of portions, juxtaposed in the first direction, for receiving some components of the surface acoustic waves generated from said waveguides, and outputting signals, said portions being connected, so that electric fields of electrical signals output from said portions are synthesized in the same direction.

11. A device according to claim 10, wherein said output transducer comprises a plurality of comb electrodes connected to each other, a radiation resistance value of each of said comb electrodes being substantially larger than ⅓ an electrode resistance value of each of said comb electrodes.

12. A device according to claim 11, wherein said element satisfies the following condition:

$$\frac{r \cdot w}{d \cdot h \cdot N} < \frac{3K^2}{\pi^2 \cdot f \cdot \epsilon \cdot w}$$

where w is a maximum intersection width of the comb electrode, r is a resistivity of the comb electrode, d is a line width of the comb electrode, h is a film thickness of the comb electrode, N is the number of electrode fingers of the comb electrode $K^2$ is an electro-mechanical coupling coefficient of said substrate, f an operating frequency of said element, and $\epsilon$ is a permittivity of said substrate.

13. A device according to claim 10, wherein said plurality of portions of said output transducer are electrically connected in series with each other.

14. A device according to claim 10, wherein said plurality of portions of said output transducer are electrically connected in parallel with each other.

15. A device according to claim 10, wherein some of said plurality of portions of said output transducer are electrically connected in series with each other, and remaining portions are electrically connected in parallel with each other.

16. A device according to claim 10, wherein said output transducer comprises a doglegged comb electrode having at least two sections.

17. A device according to claim 10, wherein said plurality of portions of said output transducer are connected to each other by printed wiring lines formed on said substrate.

18. A device according to claim 10, wherein said waveguides generate the elastic surface waves toward two sides of an arranging direction thereof, and said output transducer comprises first and second transducers for receiving the surface acoustic waves in two direction, each of said first and second transducers comprising a plurality of portions, juxtaposed in the first direction, for receiving some components of the surface acoustic waves generated from said waveguides, and outputting signals.

19. A signal receiver comprising:
(a) a reception circuit for receiving a modulated signal transmitted from a transmitter;
(b) a reference signal generating circuit for generating a reference signal;
(c) a surface acoustic wave device for outputting a convolution signal of the signal received by said reception circuit, and the reference signal; and
(d) a demodulation circuit for demodulating information using the convolution signal output from said surface acoustic wave device,
said surface acoustic wave device comprising:
a piezoelectric substrate;
a first input transducer, formed on said substrate, for generating a surface acoustic wave corresponding to a signal received by said reception circuit;
a second input transducer, formed on said substrate, for generating a surface acoustic wave corresponding to the reference signal;
a plurality of waveguides which are juxtaposed on a region of said substrate where the surface acoustic waves from said first and second input transducers overlap each other, and in which a convolution signal of the input signals is generated due to an interaction of the surface acoustic waves, said waveguides generating a surface acoustic wave corresponding to the convolution signal; and
an output transducer for receiving the surface acoustic wave from said waveguides, converting the third surface acoustic wave into an electrical signal, and outputting the electrical signal, said output transducer comprising a plurality of portions, juxtaposed in a widthwise direction of the surface acoustic waves generated from said waveguides, for receiving some components of the surface acoustic waves generated from said waveguides, and outputting signals, said portions being connected, so that electric fields of electrical signals output from said portions are synthesized in the same direction.

20. A receiver according to claim 19, wherein said output transducer comprises a plurality of comb electrodes connected to each other, a radiation resistance value of each of said comb electrodes being substantially larger than $\frac{1}{3}$ an electrode resistance value of each of said comb electrodes.

21. A receiver according to claim 20, wherein said surface acoustic wave element satisfies the following condition:

$$\frac{r \cdot w}{d \cdot h \cdot N} < \frac{3K^2}{\pi^2 \cdot f \cdot \epsilon \cdot w}$$

where w is a maximum intersection width of the comb electrode, r is a resistivity of the comb electrode, d is a line width of the comb electrode, h is a film thickness of the comb electrode, N is the number of electrode fingers of the comb electrode, $K^2$ is an electro-mechanical coupling coefficient of said substrate, f is an operating frequency of said element, and $\epsilon$ is a permittivity of said substrate.

22. A receiver according to claim 19, wherein said plurality of portions of said output transducer are electrically connected in series with each other.

23. A receiver according to claim 19, wherein said plurality of portions of said output transducer are electrically connected in parallel with each other.

24. A receiver according to claim 19, wherein some of said plurality of portions of said output transducer are electrically connected in series with each other, and remaining portions are electrically connected in parallel with each other.

25. A receiver according to claim 19, wherein said output transducer comprises a doglegged comb electrode having at least two sections.

26. A receiver according to claim 19, wherein said plurality of portions of said output transducer are connected to each other by printed wiring lines formed on said substrate.

27. A receiver according to claim 19, wherein said waveguides generate the surface acoustic waves toward two sides of an arranging direction thereof, and said output transducer comprises first and second transducers for receiving the surface acoustic waves in two directions, each of said first and second transducers comprising a plurality of portions, juxtaposed in a widthwise direction of the surface acoustic waves generated from said waveguides, for receiving some components of the surface acoustic waves generated from said waveguides, and outputting signals.

28. A receiver according to claim 19, further comprising a detection circuit for receiving the convolution signal generated from said output transducer, and outputting a detected signal to said demodulation circuit.

29. A receiver according to claim 28, further comprising a synchronous circuit for outputting a synchronous signal generated based on the convolution signal to said reference signal generating circuit.

30. A receiver according to claim 19, wherein the signal transmitted from said transmitter is spectrum-spread, and said receiver further comprises a synchronous circuit for generating a synchronous signal based on the convolution signal, and a despreading circuit for reproducing a signal before spectrum spreading on the basis of the signal received by said reception circuit, and the synchronous signal, and inputting the reproduced signal to said demodulation circuit.

31. A communication system comprising:
(a) a transmitter for transmitting a signal modulated according to information;
(b) a reception circuit for receiving the modulated signal transmitted from said transmitter;
(c) a reference signal generating circuit for generating a reference signal;
(d) a surface acoustic wave element for outputting a convolution signal of the signal received by said reception circuit, and the reference signal; and
(e) a demodulation circuit for demodulating the information using the convolution signal output from said surface acoustic wave element, said surface acoustic wave element comprising:
a piezoelectric substrate;
a first input transducer, formed on said substrate, for generating a surface acoustic wave corresponding to a signal received by said reception signal;
a second input transducer, formed on said substrate, for generating a surface acoustic wave corresponding to the reference signal;
a plurality of waveguides which are juxtaposed on a region of said substrate where the surface acoustic waves from said first and second input transducers overlap each other, and in which a convolution signal of the input signals is generated due to an interaction of the surface acoustic waves, said waveguides generating a surface acoustic wave corresponding to the convolution signal; and
an output transducer for receiving the surface acoustic wave from said waveguides, converting the convolution signal into an electrical signal, and outputting the electrical signal, said output transducer comprising a plurality of portions, juxtaposed in a widthwise direction of the surface acoustic waves generated from said waveguides, for receiving some components of the surface acoustic waves generated from said waveguides, and outputting signals, said portions being connected, so that electric fields of electrical signals output from said portions are synthesized in the same direction.

32. A system according to claim 31, wherein said output transducer comprises a plurality of comb electrodes connected to each other, a radiation resistance value of each of said comb electrodes being substantially larger than ¼ an electrode resistance value of each of said comb electrodes.

33. A system according to claim 32, wherein said surface acoustic wave element satisfies the following condition:

$$\frac{r \cdot w}{d \cdot h \cdot N} < \frac{3K^2}{\pi^2 \cdot f \cdot \epsilon \cdot w}$$

where w is a maximum intersection width of the comb electrode, r is a resistivity of the comb electrode, d is a line width of the comb electrode, h is a film thickness of the comb electrode, N is the number of electrode fingers of the comb electrode, $K^2$ is an electro-mechanical coupling coefficient of said substrate, f is an operating frequency of said element, and $\epsilon$ is a permittivity of said substrate.

34. A system according to claim 31, wherein said plurality of portions of said output transducer are electrically connected in series with each other.

35. A system according to claim 31, wherein said plurality of portions of said output transducer are electrically connected in parallel with each other.

36. A system according to claim 31, wherein some of said plurality of portions of said output transducer are electrically connected in series with each other, and remaining portions are electrically connected in parallel with each other.

37. A system according to claim 31, wherein said output transducer comprises a doglegged comb electrode having at least two sections.

38. A system according to claim 31, wherein said plurality of portions of said output transducer are connected to each other by printed wiring lines formed on said substrate.

39. A system according to claim 31, wherein said waveguides generate the surface acoustic waves toward two sides of an arranging direction thereof, and said output transducer comprises first and second transducers for receiving the surface acoustic waves in two directions, each of said first and second transducers comprising a plurality of portions, juxtaposed in a widthwise direction of the surface acoustic waves generated from said waveguides, for receiving some components of the surface acoustic waves generated from said waveguides, and outputting signals.

40. A system according to claim 31, further comprising a detection circuit for receiving the convolution signal generated from said output transducer, and outputting a detected signal to said demodulation circuit.

41. A system according to claim 31, further comprising a synchronous circuit for outputting a synchronous signal generated based on the convolution signal to said reference signal generating circuit.

42. A system according to claim 31, wherein the signal transmitted from said transmitter is spectrum-spread, and said receiver further comprises a synchronous circuit for generating a synchronous signal based on the convolution signal, and a despreading circuit for reproducing a signal before spectrum spreading on the basis of the signal received by said reception circuit, and the synchronous signal, and inputting the reproduced signal to said demodulation circuit.

* * * * *

UNITED STATES PATENT AND TRADEMARK OFFICE
CERTIFICATE OF CORRECTION

PATENT NO. : 5,200,663

DATED : April 6, 1993

INVENTOR(S) : NORIHIRO MOCHIZUKI, ET AL.

It is certified that error appears in the above-identified patent and that said Letters Patent is hereby corrected as shown below:

ON THE TITLE PAGE:

IN [56] REFERENCES CITED

Under OTHER PUBLICATIONS:
       Under Nakagawa (first occurrence), "No. s" should read --No. 2--; under Lakin, "Tehory" should read --Theory--.

IN THE DRAWINGS:

SHEET 17 OF 21

FIG. 18, "CONVOLVA" should read --CONVOLVER--.

SHEET 19 OF 21

FIG. 20, "CONVOLVA" should read --CONVOLVER--.

SHEET 20 OF 21

FIG. 21, "CONVOLVA" should read --CONVOLVER--.

SHEET 21 of 21

FIG. 22, "CONVOLVA" should read --CONVOLVER--.

COLUMN 1

Line 38, "formulas" should read --formulas, are--.
   Line 41, "(t-x-x/v)" should read --(t-x/v)--.

COLUMN 2

Line 26, "element" should be deleted.

UNITED STATES PATENT AND TRADEMARK OFFICE
CERTIFICATE OF CORRECTION

PATENT NO. : 5,200,663
DATED : April 6, 1993
INVENTOR(S) : NORIHIRO MOCHIZUKI, ET AL.

It is certified that error appears in the above-identified patent and that said Letters Patent is hereby corrected as shown below:

COLUMN 4

Line 9, "transduces" should read --transducers--.

COLUMN 5

Line 34, "electrode fingers" should read --electrodes--.
Line 35, "fingers" should be deleted.
Line 37, "electrode" should read --electrodes--.
Line 38, "fingers" should be deleted.

COLUMN 6

Line 16, "the accord-" should read --the second embodiment of the surface acoustic wave device accord- --.

COLUMN 7

Line 18, "element" should read --device--.
Line 22, "element" should read --device--.

COLUMN 8

Line 52, "without" should be deleted.

COLUMN 9

Line 11, "element" should read --device--.

UNITED STATES PATENT AND TRADEMARK OFFICE
CERTIFICATE OF CORRECTION

PATENT NO. : 5,200,663

DATED : April 6, 1993

INVENTOR(S) : NORIHIRO MOCHIZUKI, ET AL.

It is certified that error appears in the above-identified patent and that said Letters Patent is hereby corrected as shown below:

COLUMN 12

Line 41, "diagrams" should read --diagram--.
Line 42, "element" should be deleted.
Line 52, "element" should read --device--.

COLUMN 13

Line 8, "shown" should read --shows--.

COLUMN 14

Line 23, "form" should read --from--.
Line 36, "form" should read --from--.
Line 60, "apologized" should read --apodized--.

COLUMN 15

Line 59, "$\underline{\epsilon}$" should read --$\epsilon$--.

COLUMN 16

Line 39, "third surface acoustic wave;" should read --convolution signal;--.
Line 41, "convolution signal" should read --third surface acoustic wave--.
Line 68, "electrode" should read --electrode,--.

COLUMN 17

Line 1, "f an" should read --f is an--.
Line 26, "direction," should read --directions,--.

UNITED STATES PATENT AND TRADEMARK OFFICE
CERTIFICATE OF CORRECTION

PATENT NO. : 5,200,663
DATED : April 6, 1993
INVENTOR(S) : NORIHIRO MOCHIZUKI, ET AL.

It is certified that error appears in the above-identified patent and that said Letters Patent is hereby corrected as shown below:

<u>COLUMN 18</u>

Line 13, "element" should read --device--.
   Line 25, "$\underline{\epsilon}$" should read --$\epsilon$--.

<u>COLUMN 20</u>

Line 11, "$\underline{\epsilon}$" should read --$\epsilon$--.

Signed and Sealed this

Fifth Day of April, 1994

Attest:

BRUCE LEHMAN

*Attesting Officer*     *Commissioner of Patents and Trademarks*